US009503123B1

(12) United States Patent
Pinho et al.

(10) Patent No.: US 9,503,123 B1
(45) Date of Patent: Nov. 22, 2016

(54) RANDOM ACCESS TO COMPRESSED DATA USING BITWISE INDICES

(71) Applicant: EMC Corporation, Hopkinton, MA (US)

(72) Inventors: Rômulo Teixeira de Abreu Pinho, Niteroi (BR); Angelo E. M. Ciarlini, Rio de Janeiro (BR)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 14/749,826

(22) Filed: Jun. 25, 2015

(51) Int. Cl.
*H03M 7/34* (2006.01)
*H03M 7/42* (2006.01)
*G06F 7/483* (2006.01)

(52) U.S. Cl.
CPC .............. *H03M 7/425* (2013.01); *G06F 7/483* (2013.01)

(58) Field of Classification Search
CPC ...... H03M 7/42; H03M 7/30; H03M 7/3086; H03M 7/3088; H03M 7/4006; H03M 7/55
USPC .................................... 341/51, 52, 106, 107
See application file for complete search history.

(56) References Cited

U.S. PATENT DOCUMENTS 5,617,552 A * 4/1997 Garber .................. G06F 12/023 341/51
6,519,733 B1 * 2/2003 Har ..................... G06F 11/1004 714/758
7,102,552 B1 * 9/2006 Archbold ................ H03M 7/30 341/50
7,443,321 B1 * 10/2008 Kaufman .......... G06F 17/30312 341/106
8,866,647 B2 * 10/2014 Kataoka .................. H03M 7/40 341/65
2002/0123886 A1 * 9/2002 Globerson .......... G10L 21/0364 704/219
2006/0101223 A1 * 5/2006 Lekatsas ............. G06F 12/0802 711/173
2006/0112264 A1 * 5/2006 Agarwal ................ H03M 7/30 713/150
2008/0224901 A1 * 9/2008 Pang ................... G10L 19/0017 341/50
2008/0267513 A1 * 10/2008 Sankaran ............ H03M 7/4006 382/232
2011/0202273 A1 * 8/2011 Nogtev .................. G01C 21/32 701/532

OTHER PUBLICATIONS

Yushin et al., "A Fast and constant time random access decoding with log2(N) block seek time", [Conference] // Proc. of SPIE-IS&T Electronic Imaging.—[s.I.] : SPIE and IS&T, 2005.—vol. 5682.

(Continued)

*Primary Examiner* — Linh Nguyen
(74) *Attorney, Agent, or Firm* — Ryan, Mason & Lewis, LLP

(57) ABSTRACT

Methods and apparatus are provided for random access to compressed data using bitwise indices, enabling interaction with compressed data as if interaction were with an uncompressed version thereof. A compressed file is decompressed using an index table comprising a bitwise mapping between individual bits in the compressed file and corresponding portions of an uncompressed version of the compressed file; and decompressing at least a portion of the compressed file using the index table. Different data types within a file are optionally managed by separate index tables. A block-based file system can process index tables to provide transparent access to the compressed file. The index tables support dynamic index granularities, without decompressing the compressed file and recompressing it. The decompressed portion of the compressed file is optionally stored in a cache, possibly with neighbor portions pre-fetched using the index tables. Multi-resolution compression and quality-based decompression are also provided without space overhead.

27 Claims, 15 Drawing Sheets

BITWISE OFFSET 0 | BITWISE OFFSET 1 | BITWISE OFFSET 2
410 F: $B_0$ $B_1$ $B_2$ $B_3$ $B_4$ $B_5$ $B_6$ $B_7$ $B_8$ ...
REQUESTED SAMPLE$_i$
420 T: $IDX_0$ $IDX_1$ $IDX_2$ ...

500
510 FIND IN INDEX TABLE ASSOCIATED WITH COMPRESSED DATA BIT INDEX $b$ WHOSE ASSOCIATED SAMPLE INDEX (OR CORRESPONDING BYTE OFFSET WITHIN ORIGINAL FILE) IS CLOSEST TO $i$, BEING LESS THAN OR EQUAL TO $i$ (IN FIG. 4, THE INDEX IN $IDX_1$)
520 FIND IN COMPRESSED FILE BYTE $B = b/8$, WHICH CONTAINS BIT INDEX RETRIEVED FROM INDEX TABLE (IN FIG. 4, BYTE $B_3$)
530 READ THAT BYTE FROM FILE AND ACCESS BIT $\hat{b} = b$ MODULO 8 WITHIN BYTE $B$
540 DECOMPRESS SEISMIC SAMPLES STARTING AT $\hat{b}$ UNTIL SAMPLE $i$ IS REACHED

(56) References Cited

OTHER PUBLICATIONS

Ciarlini et al., "Methods and Apparatus for Parallel Evaluation of Pattern Queries Over Large N-Dimensional Datasets to Identify Features of Interest" (Pending). U.S. Appl. No. 14/672,516, filed Mar. 30, 2015.
Ciarlini et al., "Heteroscedastic Data Compression Using Arima-Garch Model Estimation", (Pending) U.S. Appl. No. 14/230,510, filed Mar. 31, 2014.
Elias, P., "Universal codeword sets and representations of the integers", IEEE Transactions on Information Theory.—[s.I.] : IEEE, 1975.—2 : vol. 21.—pp. 194-203.
Antonin Guttman, "R-trees: a dynamic index structure for spatial searching", ACM SIGMOD Record .—Boston, Massachusetts : ACM, 1984.—14 : vol. 2.—pp. 47-57.
Samet et al., "Storing a Collection of Polygons Using Quadtrees", ACM Transactions on Graphics.—Boston, Massachussets : ACM, 1985.—pp. 182-222.
Huffman, D., "A Method for the Construction of Minimum-Redundancy Codes" Proceedings of the IRE.—[s.I.] : IEEE, 1952.—9 : vol. 40.—pp. 1098-1101.
Ogg, "Ogg bitstream overview" Xiph.org.—2010.—Dec. 10, 2014.—https://xiph.org/ogg/doc/oggstream.html.
Kumar Senapati Ranjan, "Development of Novel Image Compression" PhD Thesis / Department of Electronics and Communication Engineering; National Institute of Technology.—Rourkela, Odisha, India; pp. 118-120, Sec. 4.4.1.5 (2012).
Andrew S. Tannenbaum, "Modern Operating Systems" Third Edition; pp. 913-914, Sec 11.8; Prentice Hall, (2001).
Taubman et al., "JPEG2000: standard for interactive imaging" Proceedings of the IEEE.—New York : IEEE, 2002.—8 : vol. 90.—pp. 1336-1357.
Keith Thurek, "IBM Real-time Compression impacts Big Data" IBM.—IBM, Jun. 19, 2012.—https://www.ibm.com/developerworks/community/blogs/DataCenter7/entry/ibm_realtime_compression_impacts_big_data2?lang=en.
Vorbosfile "Seeking" Xiph.org.—2010.—Dec. 10, 2014.—https://xiph.org/vorbis/doc/vorbisfile/seeking.html.
Ziv, J., "A universal algorithm for sequential data compression" Information Theory, IEEE Transactions on.—[s.I.] : IEEE, May 1977.—3 : vol. 23.—pp. 337-343.
Ziviani et al., "Compression: A Key for Next-Generation Text Retrieval Systems" Computer.—Los Alamitos : IEEE Computer Society, 2000.—11 : vol. 33.—pp. 37-44.

* cited by examiner

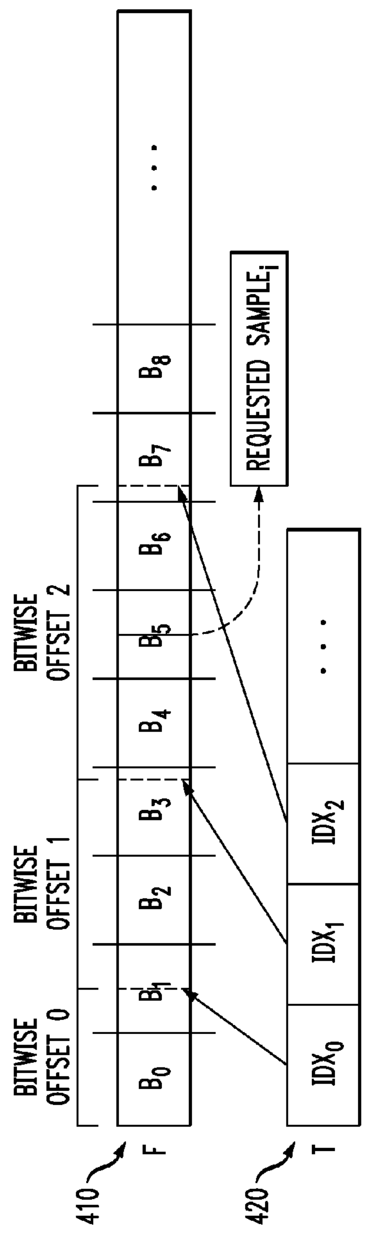
FIG. 4
410
F
420
T
BITWISE OFFSET 0
BITWISE OFFSET 1
BITWISE OFFSET 2
B0
B1
B2
B3
B4
B5
B6
B7
B8
. . .
REQUESTED SAMPLEi
IDX0
IDX1
IDX2
. . .

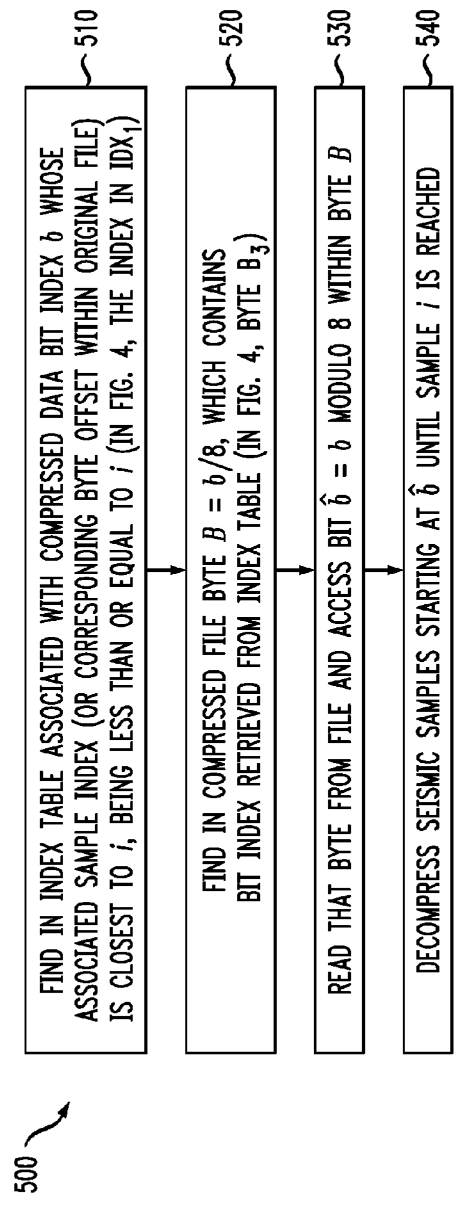
FIG. 5
500
510
FIND IN INDEX TABLE ASSOCIATED WITH COMPRESSED DATA BIT INDEX b WHOSE ASSOCIATED SAMPLE INDEX (OR CORRESPONDING BYTE OFFSET WITHIN ORIGINAL FILE) IS CLOSEST TO i, BEING LESS THAN OR EQUAL TO i (IN FIG. 4, THE INDEX IN IDX1)
520
FIND IN COMPRESSED FILE BYTE B = b/8, WHICH CONTAINS BIT INDEX RETRIEVED FROM INDEX TABLE (IN FIG. 4, BYTE B3)
530
READ THAT BYTE FROM FILE AND ACCESS BIT b̂ = b MODULO 8 WITHIN BYTE B
540
DECOMPRESS SEISMIC SAMPLES STARTING AT b̂ UNTIL SAMPLE i IS REACHED

```
compress (
        input: FILE_HANDLE, {handle to original file}
        data_handle: DATA_HANDLE {handle to compressed data and index tables}
        )
        {index to compressed samples}
        sample_index = get_sample_index_table(data_handle)
610     handle to compressed bit stream}
        sample_data = get_sample_data(data_handle)
        {constant index spacing between samples}
        index_spacing = get_index_spacing(sample_index)

        sample_count = (zero)

        {traverse original file}
        while (not end_of_file(input))
                {based on the current input file position, infer whether a header should  be processed}
                if (in_header(input))
                        extract_and_compress_header(input)
615             else
                        {retrieve next sample from input}
                        sample = get_next_sample(input)
                        {TO FIG. 6B}
```

```
            {FROM FIG. 6A}
            {compress sample using the Turbo version of either Minimal-
620         Length or Alignment compression}
            compressed_sample = compress_sample(sample)

            sample_count = sample_count + 1

            {check if an index should be added}
            if (sample_count modulo index_spacing = 0)
                {get current bitwise file position from output bit stream}
                bitwise_position = get_file_position(sample_data)
630             {add index relating current sample with position in
                bit stream}
                add_index (sample_index, sample_count, bitwise_position)
            end
        end

        {write compressed sample to compressed bit stream}
        put_sample (sample_data, compressed_sample)
    end
end
```

TRACE 0
TRACE 1
TRACE 2
TRACE 3
TRACE 4
TRACE 5
REQUESTED SAMPLE$_i$
710
F
720
T
IDX$_0$
IDX$_1$
IDX$_2$
- BITWISE OFFSET
-COEFFS. OF PREDICTOR

```
BYTE_ARRAY get_seismic_data(
    data_handle: DATA_HANDLE, {handle to compressed data and index tables}
    start: BYTE_OFFSET, {offset w.r.t. original SEGY file}
    end: BYTE_OFFSET {offset w.r.t. original SEGY file}
    )

810   {index to compressed samples}
      sample_index = get_sample_index_table(data_handle)
      {handle to compressed samples}
      sample_data = get_sample_data(data_handle)

      {index to compressed headers}
      header_index = get_header_index_table(data_handle)
      {handle to compressed headers}
      header_data = get_header_data(data_handle)

      {using the fact that SEGY headers have fixed sizes, identify whether the
       start offset corresponds to header or trace data}
815   if (in_header(start))
        context 'header'
      else
        context = 'trace'
      end
      {TO FIG. 8B}
```

```
{FROM FIG. 8A}
output = header = trace = (empty)
offset = start
while (offset < end)

    if (context = 'header')
            {find in the index table of the headers the entry whose
            associated offset within the original file is closest to 'offset' }
            h_index = get_header_index(header_index, offset)

            {decompress current header starting at the bitwise location
            within the compressed data associated with the retrieved index}
            bitwise_position = get_bitwise_offset(h_index)
            header = decompress_header(header_data, bitwise_position)
    820-1
            {compute the number of bytes of the decompressed portion of the
            header using the byte offset within the original file
            associated with the retrieved index}
            end_header = get_byte_offset(h_index) + size_in_bytes(header)
            if (end_header >= end)
                    end_header = end
            end
            num_bytes = end_header - offset
            {TO FIG. 8C}
```

```
            {FROM FIG. 8B}
            {compute initial byte of the decompressed portion of the header}
            initial_byte = offset - get_byte_offset(h_index)

            {accumulate output: just the necessary number of bytes of the
            header after the initial byte}
820-2       output = concatenate (output, header, initial_byte, num_bytes)

            {advance offset}
            offset = offset + num_bytes

            {update context}
            context = 'trace'
      else {context is equal to 'trace'}
            {find in the index table of the samples the entry whose associated
            offset within the original file is closest to 'offset'}
            t_index = get_sample_index(sample_index, offset)

830-1       {decompress current trace starting at the bitwise location within
            the compressed data associated with the retrieved index}
            bitwise_position = get_bitwise_offset(t_index)
            trace = decompress_trace (sample_data, bitwise_position)
            {TO FIG. 8D}
```

```
                {FROM FIG. 8C}
                {compute the number of bytes of the decompressed portion of the
                trace using the byte offset within the original file associated
                with the retrieved index}
                end_trace = get_byte_offset(t_index) + size_in_bytes(trace)
                if (end_trace >= end)
                        end_trace = end
                end
                num_bytes = end_trace - offset

                {compute initial byte of the decompressed portion of the trace}
        830-2   initial_byte = offset - get_byte_offset(t_index)

                {accumulate output: just the necessary number of bytes of the trace
                after the initial byte}
                output = concatenate(output, trace, initial_byte, num_bytes)

                {advance offset}
                offset = offset + num_bytes

                {update context}
                context = 'header'
            end

        end

    return output
```

910
F
920
C
930
T
BL0
BL1
BL2
BL3
BL4
BL5
BL6
BL7
BL8
COMPRESSION
INDEXING
IDX0
IDX1
IDX2
IDX3
IDX4
REQUESTED BYTES
915
BLOCKS RETRIEVED BY FS
918
COMPRESSED BLOCKS RETRIEVED BY FS
925
IDX3 IS THE CLOSEST INDEX TO THE START OF THE REQUESTED BLOCKS 1010
1000
F
B0
B1
B2
B3
B4
B5
B6
B7
B8
SPARSE
DENSE
SPARSE

RANDOM ACCESS TO COMPRESSED DATA USING BITWISE INDICES

CROSS-REFERENCE TO RELATED APPLICATIONS

The present application is related to U.S. patent application Ser. No. 14/579,130, filed Dec. 22, 2014, entitled "Content-Aware Lossless Compression and Decompression of Floating Point Data," incorporated by reference herein.

FIELD

The field relates generally to compression and decompression of signal data, such as seismic data.

BACKGROUND

Data compression techniques are commonly used to achieve a reduced bit rate in the digital representation of signals for efficient processing, transmission, and storage. Typically, an original file is regenerated from a compressed version of the original file even if only a small portion of the original file is needed.

Thus, a downside of many compression algorithms and tools is that the original file is often reconstructed when the user needs access to portions of the uncompressed data. Frequently, however, the user only needs to analyze, visualize or process a small portion of the data, rendering the reconstruction of the complete original file an unnecessary time and space consuming task.

A need therefore exists for decompression techniques for compressed data, such as seismic data, that enables random access to data samples without the need to regenerate the entire file.

SUMMARY

Illustrative embodiments of the present invention provide methods and apparatus for random access to compressed data using bitwise indices. In one exemplary embodiment, compressed data is decompressed by obtaining a compressed file and an index table comprising a bitwise mapping between at least a portion of individual bits in the compressed file and corresponding portions of an uncompressed version of the compressed file; and decompressing at least a portion of the compressed file using the index table.

In one exemplary embodiment, the decompressed portion comprises a desired data sample and the desired data sample is decompressed by (i) obtaining a bit index from the index table that is less than or equal to an index of the desired data sample, where the bit index of the desired data sample is relative to the uncompressed version of the desired data sample; (ii) identifying a byte in the compressed file that contains the obtained bit index; (iii) reading the identified byte from the compressed file and accessing a bit in the identified byte corresponding to the obtained bit index; and (iv) decompressing data samples starting at the accessed bit until the desired data sample is reached.

In at least one embodiment, a given entry of the index table comprises a bit index mapping a given individual bit in the compressed file to a corresponding portion of the uncompressed version and a corresponding state of a compression algorithm that compressed the compressed file at a time that the given individual bit was compressed. In one variation, input data are optionally split into a plurality of data types and corresponding bitwise indices are provided for each of the plurality of data types.

According to one aspect of the invention, the index table can be processed by a block-based file system to provide substantially transparent access to the compressed file. The block-based file system identifies one or more blocks of the uncompressed version that correspond to a requested sequence of bytes of the uncompressed version; obtains a bit index from the index table that is less than or equal to a starting index of the one or more identified blocks; retrieves a block of the compressed file containing a bit corresponding to the obtained bit index; and decompresses from a bitwise location within the retrieved block until the one or more identified blocks are regenerated.

According to another aspect of the invention, the index table is optionally configured to adapt to dynamic variations of index granularity based on one or more of an access frequency and a feature density, without decompressing the compressed file.

According to a further aspect of the invention, the decompressed portion of the compressed file is stored in a cache. A neighborhood of the decompressed portion of the compressed file can be prefetched from the compressed file using the index table, the neighborhood of the decompressed portion can be decompressed and the decompressed neighborhood can be stored in the cache.

According to yet another aspect of the invention, the compressed file comprises a multi-resolution compression that incurs substantially no space overhead other than the creation of the index table, and wherein the decompressed portion of the compressed file is decompressed based only on the index table and on a specified quality parameter.

Advantageously, illustrative embodiments of the invention provide improved lossless compression and decompression of data, such as seismic data. These and other features and advantages of the present invention will become more readily apparent from the accompanying drawings and the following detailed description.

BRIEF DESCRIPTION OF THE DRAWINGS

FIG. 4 illustrates a logical sequence of bytes of a compressed file and an exemplary associated index table;

FIG. 5 is a flow chart illustrating an exemplary implementation of random access data decompression process according to one embodiment of the invention;

FIGS. 6A and 6B, collectively, illustrate pseudo code for an exemplary compression algorithm that compresses seismic samples and headers of an input file;

FIGS. 8A through 8D, collectively, illustrate pseudo code for an exemplary random access data retrieval process that uses the bitwise index tables to retrieve exemplary seismic data comprising headers and samples directly from a compressed file;

DETAILED DESCRIPTION

Figure 1:
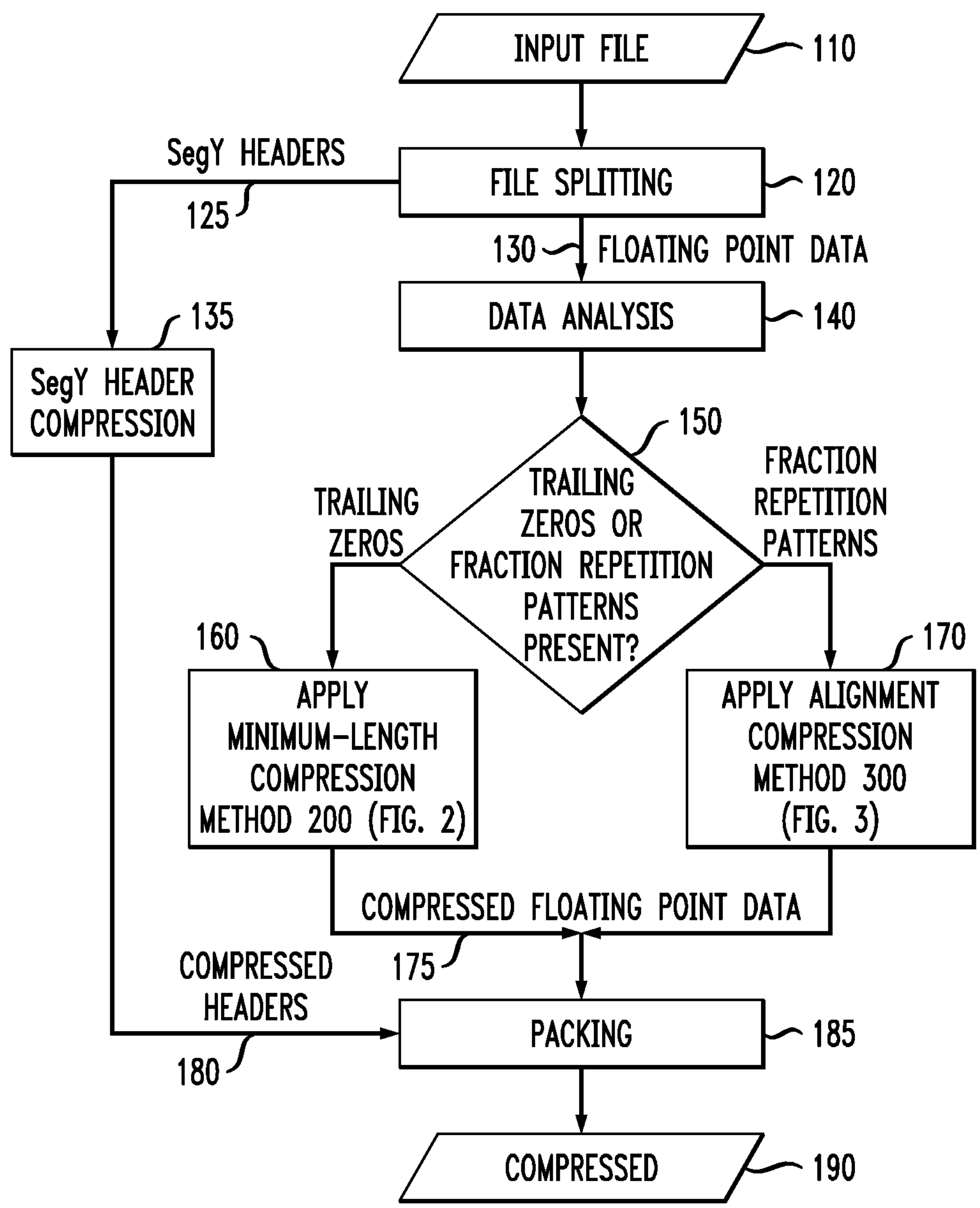
FIG. 1 is a flow chart illustrating an exemplary implementation of a data compression process.

Illustrative embodiments of the present invention will be described herein with reference to exemplary communication, storage and processing devices. It is to be appreciated, however, that the invention is not restricted to use with the particular illustrative configurations shown. Aspects of the invention provide methods and apparatus for random access to compressed data, such as seismic data, using bitwise indices. While the exemplary embodiments are described herein using seismic data, aspects of the present invention can be applied to other forms of data, as would be apparent to a person of ordinary skill in the art based on the present disclosure.

According to one aspect of the invention, compressed files, such as compressed seismic files, are randomly accessed using bitwise mappings between portions of individual bits in the compressed files and corresponding portions of an uncompressed version of the compressed files. In at least one exemplary embodiment, a desired data sample is decompressed by (i) obtaining a bit index from the index table that is less than or equal to an index of the desired data sample; (ii) identifying a byte in the compressed file that contains the obtained bit index; (iii) reading the identified byte from the compressed file and accessing a bit in the identified byte corresponding to the obtained bit index; and (iv) decompressing data samples starting at the accessed bit until the desired data sample is reached.

In at least one exemplary embodiment, the disclosed decompression techniques are based on exemplary data compression algorithms, referred to herein as content-aware lossless compression algorithms, introduced in U.S. patent application Ser. No. 14/579,130, filed Dec. 22, 2014, entitled "Content-Aware Lossless Compression and Decompression of Floating Point Data," incorporated by reference herein, provides a data oriented method for lossless compression of floating point data, such as seismic data, that employs observed phenomena in the data to obtain high compression ratios with fast algorithms. These data compression algorithms are modified as described herein to create bitwise indices during the compression process that enable random access to the compressed data.

The exemplary content-aware lossless compression algorithms comprise a minimal-length compression technique, discussed further below in conjunction with FIG. 2, and an alignment compression technique, discussed further below in conjunction with FIG. 3. The minimal-length compression technique classifies the samples so that codes describing both the exponent and the length of the significant can be used to keep only the necessary bits to represent each sample. An alignment compression technique exploits repetition patterns that can be observed in the samples when they are aligned to the same exponent, so that numbers can be broken into parts that repeat frequently and other parts that do not. The two content-aware lossless compression algorithms are optionally combined with prediction models that aim at reducing the entropy of the data. A data analysis step is employed to decide which content-aware lossless compression algorithm is the best for each input dataset, as discussed further below in conjunction with FIG. 1. Each algorithm further provides versions for fast compression and decompression (Turbo Version) or for maximum compression (Max Version).

While the exemplary embodiments employ the content-aware lossless compression algorithms as the compression algorithm, alternate compression algorithms, such as Huffman coding and Lempel-Ziv coding, or variations thereof, can be employed, as would be apparent to a person of ordinary skill in the art.

The Turbo versions of the content-aware lossless compression algorithms do not depend on data correlations, meaning that the compression/decompression of one data sample does not depend on other data samples. The Max versions of the content-aware lossless compression algorithms, however, have a limited dependence on data correlations. According to a further aspect of the invention, the data dependence is addressed by storing in the index table a state of the compression algorithm that compressed the compressed file at a time that the given individual bit was compressed in addition to the bitwise mapping of individual bits in the compressed file to corresponding portions of the uncompressed version.

A further aspect of the invention integrates the disclosed random access data decompression techniques with a block-based file system. The indexing mechanism enables the file system to transparently translate any type of access to the original data, such as seismic data (headers, traces, samples, or any combination thereof), into a request to retrieve the blocks that contain the corresponding compressed data, decompress them, and assemble them in their original form. In this manner, applications, such as seismic processing applications, can interact with the compressed data directly through the file system, as if they were accessing the original file.

An adaptive indexing aspect of the invention provides bitwise index tables with variable index densities within the same compressed file based on an access frequency and/or a feature density. Among other benefits, the adaptive indexing makes queries over localized portions of the compressed data more efficient. Furthermore, the index table can be updated or completely reconstructed in order to adapt to dynamic index densities without the need to reconstruct the uncompressed version of the file to which it is mapped.

According to another aspect of the invention, the random access to compressed data is optionally augmented with cache and prefetching techniques that improve the on-demand decompression of compressed data, such as seismic data.

The bitwise indexing disclosed herein further enables the use of multi-resolution compression and quality-oriented access to the compressed data without the need to store the data at different resolutions. In addition, different decompression qualities can be efficiently generated for different portions of the data using the adaptive indexing mechanism.

Another aspect of the invention provides "content-aware" index tables. In this manner, different index tables are optionally created and managed for different types of data within the same file (e.g., headers and data samples).

Content-Aware Lossless Compression Algorithms

FIG. 1 is a flow chart illustrating an exemplary implementation of a data compression process 100. The exemplary data compression process 100 processes seismic data stored in SegY files. Compression of other kinds of floating point data can be adapted from the exemplary embodiment, as would be apparent to a person of ordinary skill in the art. Overall, an input file 110 is split into SegY headers 125 and floating point data values 130 at a file splitting stage 120. The SegY headers 125 are compressed during step 135, for example, with standard entropy encoders.

The floating point data values 130 are processed during step 140 to determine which compression technique 200, 300 is the best for the input file 110, and will follow one of two possible workflows. The data analysis 140 can be carried out on random, small subsets of the input file 110. Statistics on the length of significants of floating point data and on repetition patterns are obtained and ranked. By dividing the input file 110 into chunks, the choice of the compression workflow can optionally be optimized on a chunk-by-chunk basis, enabling the compression of several chunks to be executed in parallel, to maximize performance.

A test is performed during step 150 to determine if trailing zeros or fraction repetition patterns are present in the input file 110. If it is determined during step 150 that trailing zeros are present, then program control proceeds to step 160 for compression using the minimum-length compression method 200 (FIG. 2) to process floating point data that can be trimmed. If, however, it is determined during step 150 that fraction repetition patterns are present, then program control proceeds to step 170 for compression using the exemplary alignment compression method 300 (FIG. 3). As discussed further below in conjunction with FIGS. 2 and 3, each workflow type can optionally be tuned for turbo or maximal compression.

Finally, compressed floating point data values 175 and compressed headers 180 are applied to a packing module during step 185, which organizes the compressed floating point data values 175 and compressed headers 180 in one or more compressed files 190 for access by a decompressor.

The algorithms for decompressing the compressed data are straightforward to a person of ordinary skill in the art, based on the discussion of the compression algorithms provided herein. The execution times of the decompression algorithms vary between 50% and 100% of the compression times. Thus, the remaining discussion focuses primarily on the description of the compression algorithms.

Min-Length Compression

Figure 2:
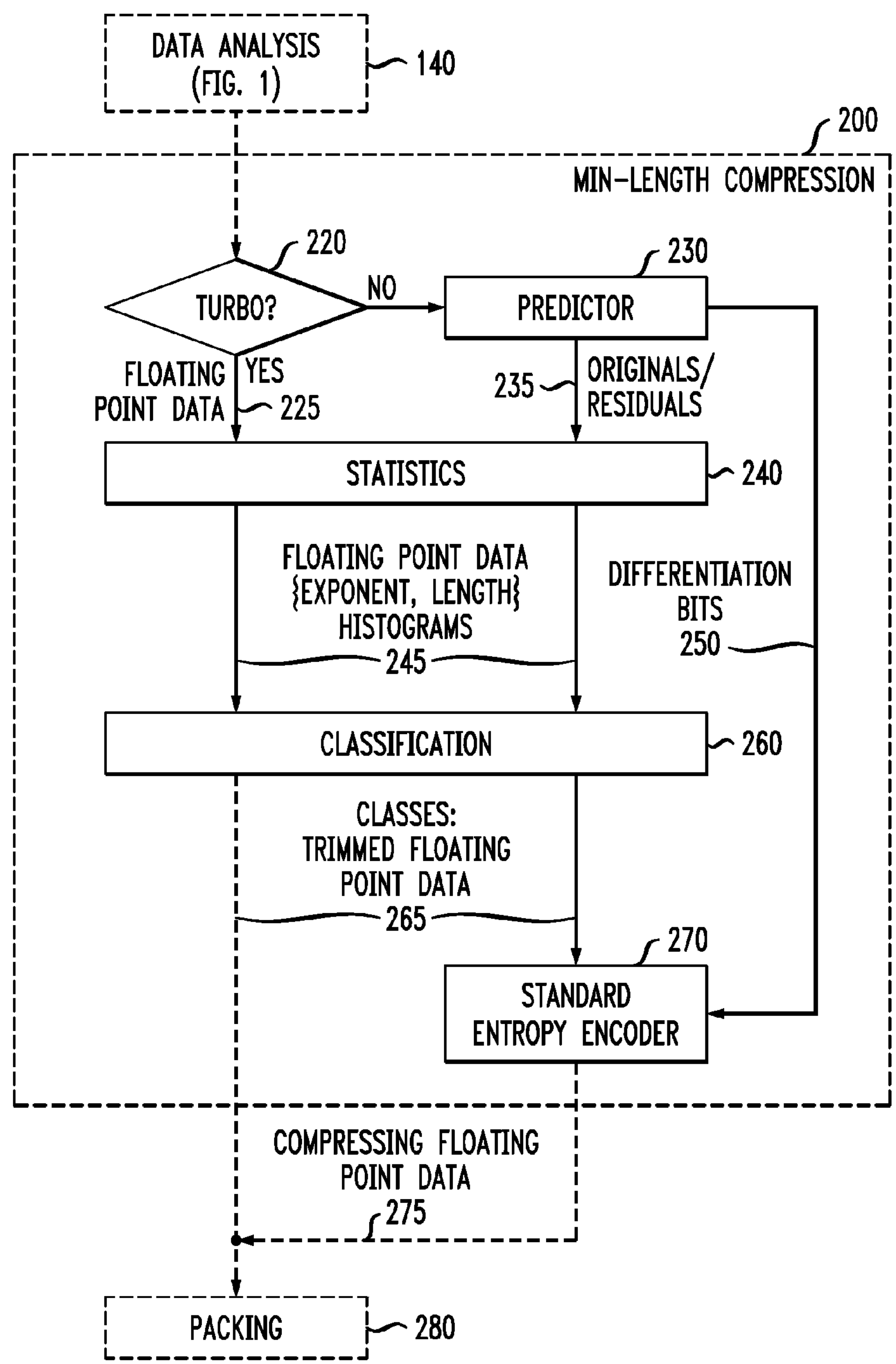
FIG. 2 is a flow chart illustrating an exemplary implementation of a minimum-length compression method.

FIG. 2 is a flow chart illustrating an exemplary implementation of the minimum-length compression method 200. As previously indicated, the exemplary minimum-length compression method 200 compresses the input file 110 by removing unnecessary trailing zeros from significands. If zeros are removed from the original data, this information needs to be stored so that the original number can be rebuilt in the decompression phase, without data loss. Bookkeeping for such information for every sample can be costly and may result in poor compression performance. The exemplary minimum-length compression method 200 balances the removal of zeros and the bookkeeping. As discussed above, the minimum-length compression method 200 can optionally be tuned for turbo or maximal compression.

Thus, a test is performed during step 220 to determine if a turbo compression or a maximal compression will be performed. If it is determined during step 220 that a turbo compression will be performed, then program control proceeds directly to step 240 to process the floating point data 225.

The exemplary minimum-length compression method 200 works in two passes through the data. In the first pass, statistics on the lengths of the significands and their correlation with the corresponding exponents are gathered during step 240. Every {exponent, length} pair is defined as a class and the statistics indicate how many bits can be saved if a specific code is created for that class and the trailing zeros of the significand of the samples of that class are removed. The output of the statistics phase 240 is a collection of histograms 245 of {exponent, length} pairs.

Given a (configurable) superior limit, N>0, to the number of classes to be represented, the exemplary minimum-length compression method 200 carries out a second pass through the input file 110 during step 260, removing zeros from samples of those classes in the histogram data 245 that will yield the best compression ratios in the trimmed floating point data 265. The referred superior limit N determines how many bits are necessary to store class codes associated with {exponent, length} pairs. The remaining classes are optionally grouped so that the highest number of zeros can be removed with the least amount of bookkeeping.

For classes associated with {exponent, length} pairs, let $B_c=\lceil \log_2 N \rceil$ be the number of bits necessary to store class codes, $B_s=1$ be the number of bits to store the sign of the floating point number, and $B_l$=length be the number of bits to store its significand. The classification of the samples during step 260 creates six types of classes:

- Classes that represent a single exponent and a single length: in this case, for each sample, $[B_s+B_c+(B_l-1)]$ bits are stored, since the least significant bit of the significand is known to be 1 and, as such, does not need to be stored.
- Classes that represent, for a single exponent, all lengths equal to or less than the length representative of the class: in this case, $[B_s+B_c+B_l]$ bits are stored for each sample (note that the least significant bit needs to be stored).
- Classes that combine consecutive exponents that can be aligned, having a maximum length: in this case, $[B_s+B_c+B_l+1]$ bits are stored. Notice that the most significant bit 1 of the significand, which is hidden in the IEEE 754 format, has to be explicitly represented when numbers having different exponents are mixed, so that the alignment can be reverted upon decompression.
- Classes that combine pairs of exponents that have different lengths: in this case, each sample can be represented by one extra bit that distinguishes the case of one exponent from the other and the corresponding length 210 minus one bit, since we do not need to store the least significant bit. Thus, $[B_s+B_c+B_l]$ bits are stored for each sample of these classes.
- Classes that combine exponents that only have associated lengths of zero or one bit: in this case, no bits of the significand are stored, only a code with $B_z=\lceil \log_2 N_z \rceil$ bits (wherein $N_z$ is the total number of zero-length classes), which will enable the reconstruction of the class at the decompression time. Consequently, $[B_s+B_c+B_z]$ bits are stored.
- Classes that handle exceptions: the IEEE 754 format specifies special binary codes for numbers that cannot be represented (also known as "not-a-number", or NaN). These are stored as members of the zero-length classes, in their original form (i.e., with 32 bits), with $[B_s+B_c+B_z+32]$ bits in total.

The grouping of the classes is performed in such a way that most of the samples have a code that exactly specifies the exponent and the length. Classes that group exponents and lengths are chosen to substantially maximize the overall result. As the representation of the samples in these classes demand additional bits, combinations of exponents and lengths that have lower rates in the statistics are chosen to be grouped. Typically, for each exponent, longer lengths that do not have high frequencies are grouped. Additionally, short lengths, all of them with low frequencies, are grouped in a single class.

The size of the code is a (configurable) parameter of the minimum-length compression method 200, which may be defined as either 5 or 6 bits, for example.

If it is determined during step 220 that a maximal compression will be performed, then a prediction is performed during step 230, before program control proceeds to step 240 to process the original values and residual values 235. The variation of the minimum-length compression method 200 for maximum compression works in a similar manner as the turbo version described above. The difference is that a linear prediction algorithm is employed during step 230 to predict the value of every data sample based on a sequence of previous samples. A number of exemplary algorithms are available. See, for example, Monson H. Hayes, "9.4: Recursive Least Squares," Statistical Digital Signal Processing and Modeling, p. 541 (Wiley, 1996); or U.S. patent application Ser. No. 14/230,510, filed Mar. 31, 2014, entitled "Heteroscedastic Data Compression Using Arima-Garch Model Estimation," each incorporated by reference herein.

Generally, a linear prediction algorithm is employed during step 230 in order to use a prediction error, or residual, as the input for the compression algorithm, instead of the original data. Depending on the quality of the employed predictor, the residual can be very small. Consequently, it would need fewer significant bits to be represented, in comparison with the original data, resulting in more effective compression.

In the case of floating point data, the residual could have a longer length, even if its absolute value is lower than that of the original value. To ensure that the residual values demand fewer bits than the original values, the following strategy is adopted in the exemplary embodiment:

- During compression, the prediction and the original value are aligned to the same exponent, and the prediction is truncated at the bit that precedes the least significant bit 1 of the original value. By doing this, the least significant bit of the residual will be the least significant bit 1 of the original value when they are aligned. If the absolute value of the residual is lower than that of the original value, its length is equal to or shorter than that of the original value when the exponents are restored.
- During decompression, the residual value is aligned with the prediction (which is the same prediction originated at compression time) and the prediction is truncated at the bit that precedes the least significant bit 1 of the residual. The residual is then added to the prediction in order to exactly obtain the original value.

On average, it has been observed that residuals are indeed "shorter" than the original data samples. In order to maximize the compression ratios even further, the residual is replaced with the original sample whenever the former needs, in reality, more bits to be represented. Only one bit of bookkeeping, referred to in FIG. 2 as a differentiation bit 250, is necessary to differentiate between the two types, therefore with minimal impact. As the frequency in which residuals are longer than the original values is low, the compression of this differentiation bit 250 is very high, so that this differentiation tends to increase compression ratio.

In the maximum compression mode, the trimmed floating point data 265 generated by the classification 260 and the differentiation bits 250 are further processed using an entropy encoder 270, in a known manner.

Finally, compressed floating point data values 275 are applied to a packing module during step 280, which organizes the compressed floating point data values 275 in one or more compressed files for access by a decompressor.

Alignment Compression

Figure 3:
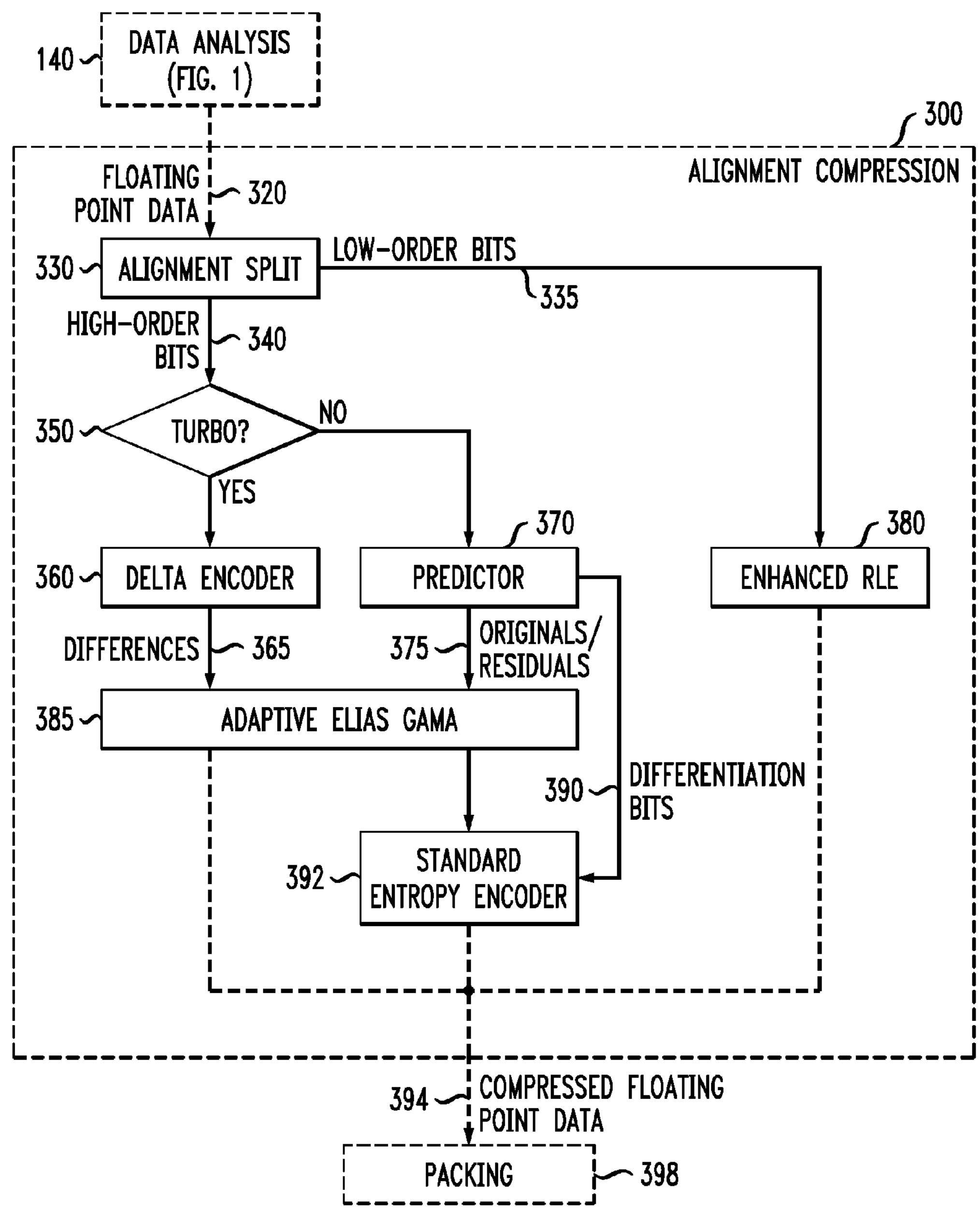
FIG. 3 is a flow chart illustrating an exemplary implementation of an alignment compression method.

FIG. 3 is a flow chart illustrating an exemplary implementation of the alignment compression method 300. The exemplary alignment compression method 300 leverages repetition patterns in the fractional part of the seismic floating point data, as described above, for improved compression.

Existing compression algorithms are specialized in data deduplication. Although many existing compression algorithms are able to cover a large spectrum of repetition patterns, the alignment compression method 300 employs more in-depth analyses of patterns present in seismic sample data and is therefore fine-tuned for the compression of such type of data.

Generally, the alignment compression method 300 recognizes that the repetition patterns occur primarily in the fractional part of the sample data. Due to sensor precision limitations, only a restricted set of fractions might be represented during data acquisition. These fractions occur frequently, and they also tend to repeat in alternating patterns along extended sequences of samples. Having that in mind, the alignment compression method 300 works by splitting the input floating point data 320 into integral and fractional parts during step 330. Splitting a floating point number means to find the bit of the significand that corresponds to the location of the radix point, taking into account the exponent of the number. A "high order" (integral) significand 340 and a "low order" (fractional) significand 335 are generated as a result of this process. The splitting performed during step 330 can be done in one of two possible ways:

- Align the number to the exponent zero (most typical approach). In this case, the split precisely defines the integral and fractional parts of the number.
- Align the number to a calculated exponent. Since alignment involves binary shifting operations within 32 bits, it might not be possible to align the number to the zero exponent, depending on the distribution of the exponents across the data samples. As a result, the "central" exponent is calculated from this distribution, and all the samples are aligned to that exponent.

Whichever align/split option is chosen for step 330, there will probably be cases in which the operation cannot be done. Those will be treated as exceptions in a later step of the exemplary alignment compression method 300, described further herein. From the data analyses, it has been observed that these exceptions have very low frequency, and therefore cause minimal impact on the compression performance.

In either case, the low order part 335 resulting from the split operation must still be aligned (usually with the most significant bit of the significand) so that the repetition patterns appear in binary form.

As discussed above, the exemplary alignment compression method 300 can optionally be tuned for turbo or maximal compression, which have an impact on the integral part of the data only. Thus, a test is performed during step 350 to determine if a turbo compression or a maximal compression will be performed. If it is determined during step 350 that a turbo compression will be performed, then program control proceeds to step 360, wherein a delta encoder is applied to the high order bits 340.

The exemplary alignment compression method 300 works in a single pass through the integral data. Since the data samples are a discretization of a physical phenomenon, it is expected that the difference between the integral (or high order) part of subsequent samples (i.e., an approximation of the derivative of the function corresponding to the phenomenon) will be small. In effect, this pattern can be observed throughout the data. The first step of the algorithm following the split/align operation is thus the delta encoder during step 360. The delta encoder receives as input the original samples and outputs the differences 365 between each sample and the previous one. Since the differences 365 between the integral part of subsequent samples are overall small, their entropy tends to be lower than that of the input samples.

The differences 365 between the integral part of subsequent samples are encoded during step 385 using an adaptive Elias Gama entropy encoder. See, for example, P. Elias, "Universal Codeword Sets and Representations of the Integers," IEEE Trans. on Information Theory, Vol. 21, No. 2, pp. 194-203 (March 1975), incorporated by reference herein. The Elias Gama encoder is suited for geometric probability distributions of numbers x, of the form $P(x)=(1-p)^{x-1}p$, where p is a constant less than 1. Such distributions indicate that small numbers (i.e., needing fewer bits to be represented) occur much more frequently than large numbers. The encoder transforms input numbers into codes of variable length, by fitting them into bins whose sizes are increasing powers of 2, that is, 2, 4, 8, 16, 32, 64, etc. A number N to be encoded is calculated as $N=2^{bin\text{-}index}+(N \text{ modulo } 2^{bin\text{-}index})$ and is thus represented by the bin-index in unary form (a sequence of bin-index zeros) followed by the binary form of the result of the modulo operation, which by definition requires bin-index bits to be represented. Following this scheme, the alignment compression method 300 will encode the most frequent numbers with very few bits.

The Elias Gama algorithm is extended to make it adapt to distributions that do not exactly follow the pattern of the form $P(x)=(1-p)^{x-1}p$, but still have small numbers occurring more frequently. Generally, the inferior limit of the encoding bins is increased, so that they start at the point in which the data seems to more closely fit a geometric distribution, while the superior limit is reduced to the point where the highest number within the data can be represented.

To cope with the align/split exceptions discussed above, an extra bin is added, in which the samples falling in that category are represented in their original form.

If it is determined during step 350 that a maximal compression will be performed, then a prediction is performed during step 370 to reduce the entropy of the integral part of the input data, before program control proceeds to step 385 to process the original values and residual values 375. The variation of the alignment compression method 300 for maximum compression works in a similar manner as the turbo version described above. The difference is that an integer linear prediction algorithm is employed during step 370 to predict the value of the integral part of every data sample based on a sequence of previous samples. A number of exemplary algorithms are available. See, for example, Monson H. Hayes, "9.4: Recursive Least Squares," Statistical Digital Signal Processing and Modeling, p. 541 (Wiley, 1996); or U.S. patent application Ser. No. 14/230,510, filed Mar. 31, 2014, entitled "Heteroscedastic Data Compression Using Arima-Garch Model Estimation," each incorporated by reference herein. The choice of predictor follows the same reasoning described above for the minimum-length compression method 400, including the strategy of truncating the residuals in case they need more bits to be represented than the original data and the compression of the differentiation bits 390 with standard entropy encoders.

Generally, a linear prediction algorithm is employed during step 370 in order to use a prediction error, or residual, as the input for the compression algorithm, instead of the original data. Depending on the quality of the employed predictor, the residual can be very small. Consequently, it would need fewer significant bits to be represented, in comparison with the original data, resulting in more effective compression.

The delta encoder 360 is not used in the maximum compression mode, since the combination of residuals and original values may no longer have the same differentiability patterns observed in the original data alone.

The original values and residual values 375 generated by the prediction 370 are encoded during step 385 using the adaptive Elias Gama entropy encoder, in the manner described above for the turbo mode. The output of the adaptive Elias Gama encoder 385 is provided to an entropy encoder during step 392, in a known manner, so that any pattern still present in the encoded data is identified and further compressed.

Finally, compressed floating point data values 394 are applied to a packing module during step 398, which organizes the compressed floating point data values 394 in one or more compressed files for access by a decompressor.

The fractional part (or low order bits 335) generated by the alignment split 330 is processed by an enhanced Run-Length Encoding (RLE) algorithm during step 380. Overall, the Run-Length Encoding (RLE) algorithm is effective when the same symbol appears throughout long sequences of data. In the exemplary alignment compression 300, the enhanced Run-Length encoding 380 more thoroughly exploits the alternating repetition patterns observed in the low order bits 335.

It has been observed that the sequences of repetitions of fractions follow an even more interesting pattern of repetition, in which pairs of sequences of symbols (numbers) alternate between them, i.e.,

AAAAAABBBBAAAABBBBBBBAAAAC-CCCDDDDCCCCCCDDDEEEEFFFFEE . . . .

In order to achieve compression ratios with an average count of less than one bit per sample, an enhanced form of the Run-Length encoding algorithm has been devised to cope with the patterns above. In this form, two concepts are dealt with:

- A Block represents a sequence of repetitions of the same symbol, e.g., A6, B4, A4, B7, A4, C4, D4, C6, etc. are blocks of the sequence above.
- A MegaBlock (MB) represents a sequence of repetitions alternating two symbols, e.g., $MB_1$=(A6, B4, A4, B7, A4), $MB_2$=(C4, D4, C6, D3), etc.

One MegaBlock is thus described by the number of blocks it contains and the two symbols that alternate, the first one being the symbol of the first block of the sequence. By doing this, only the number of repetitions (or block sizes) of each symbol needs to be encoded within the MegaBlock. Additionally, since the number of unique fractions tends to be small, a dictionary is created to store them. As a consequence, the MegaBlocks do not need to store the repeating fractions themselves, only their location in the dictionary. Finally, in order to save extra bits per MegaBlock, some metadata are added to each MegaBlock to indicate how many bits are strictly necessary to store dictionary locations and blocks sizes. A MegaBlock $MB_i$ is thus defined as:

$$MB_i=(N_b,B_d,D_1,D_2,B_b,BL_1,BL_2,BL_3, \ldots ,BL_{Nb}),$$

wherein Nb represents the total number of blocks in the mega block, $B_d$ is the number of bits necessary to store dictionary locations $D_1$ and $D_2$ of the two repeating symbols, $B_b$ is the number of bits necessary to store each block size, $BL_1$ is the block size of the symbol in the position $D_1$ of the dictionary, $BL_2$ is the block size of the symbol in the position $D_2$ of the dictionary, $BL_3$ is the block size of the symbol in the position $D_1$ again, and so on.

For example, $MB_1$ above would be defined as $MB_1=(5, 2, 1, 2, 3, 6, 4, 4, 7, 4)$, for a dictionary D=(A, B, C, D, E, F) derived from the example sequence. Note that only two bits would be necessary for dictionary locations and only three bits would be necessary for block sizes, since the largest dictionary position is two (knowing that $(\log_2 2)+1=2$) and the largest block size is represented by number six (knowing that $\rceil \log_2 6 \lceil=3$).

Random Access to Compressed Seismic Data

Seismic samples are often stored as seismic traces using one of several standards developed by the Society of Exploration Geophysicists (SEG) for storing seismic data. The most commonly used format is SEGY. Besides storing samples, SEGY files also contain headers that provide meta-information about the samples. Headers are present both at the beginning of the file and before each trace. Seismic datasets can have many terabytes of raw data and their processing generates other additional datasets at various points throughout the seismic processing steps.

If seismic data files are stored in compressed form, when they are necessary for a seismic processing workflow, they generally need to be decompressed first. As a consequence, users need to wait until the original files are generated before they can access the data. Additionally, the reconstructed file will waste storage space.

If a portion of the file (for instance, specific seismic traces) could be accessed without having to decompress the whole file, it is possible to save storage space without hindering the flow of execution. In fact, as some seismic processing workflows are I/O intensive, if less (i.e., compressed) data is read from disk, the overall workflow performance can even be improved. If the file I/O access is mimicked, workflows can work accessing the compressed data as if they had been previously decompressed.

This process only becomes viable when small portions of the data (e.g., seismic samples) can be decompressed independently. Traditional entropy encoders such as the Huffman algorithm usually meet this requirement. However, the entropy can be reduced if the autocorrelation and the nature of the data are more deeply explored. On the one hand, data exploration potentially increases compression ratios. On the other, data independency becomes compromised. The challenge is then how to maintain data independency, so as to enable efficient random access to portions of the compressed data, while keeping high compression ratios.

Byte Alignment

Data compression techniques convert a sequence of symbols into a representation that requires less computer storage space than the original symbols put together. In most cases, the original sequence of symbols is represented as a sequence of "whole" bytes in a file. After compression, the resulting sequence does not necessarily fit into a multiple of whole bytes, given the bitwise, variable length encoding nature of most compression algorithms. When the compressed sequence is persisted in computer storage, however, it will inevitably be written in byte-aligned form, given the byte-oriented structures of computer files.

The problem with the byte-aligned representation is that byte borders do not necessarily match unified pieces of compressed data. Consequently, traditional file indices, which are associated with bytes in the compressed file, will point to data that might not be decompressed on an ad hoc basis.

In order to cope with this issue, typical solutions for random access to compressed data are based on the subdivision of the original data into compressible chunks of bytes. Each chunk is compressed separately, governed by a metadata structure that applies to the entire set of chunks and that, ideally, will enable them to be decompressed independently, or nearly so. This is the usual method in image compression techniques, for example. Alternatively, as in the compression of video and audio data, special markers that start precisely at byte borders can be added to compressed bit streams.

Despite providing the ability to decompress data on a chunk-basis, some drawbacks with chunk subdivision approaches include:

1. Chunk sizes are determined a priori and new chunk configurations can only be done if the original file is reconstructed and compressed again;

2. In the video and audio compression case, markers are usually represented by uncompressed "key-frames", so that adding markers also adds the corresponding amount of uncompressed data to the compressed bit stream, rendering the compression less effective;

3. In the specific case of the Max versions of the Min-Length algorithm 200 and Alignment compression algorithm 300 described above, linear prediction is employed on a trace-by-trace basis. Chunk subdivisions might not match seismic trace borders, which in turn might degrade the performance of the linear prediction algorithm, since sample correlations within the seismic trace exploited by the predictor might be broken.

File System Integration

When thinking of an implementation of a decompression technique that gives transparent access to compressed data as if the data were being accessed in its original, decompressed form, two possible designs are considered:

1. The decompression is implemented as a library or a plug-in that is compatible with or customized for the application using it; or 2. The decompression is embedded in the file system, making it transparent to any application.

The first case is possibly the easiest, but requires that application developers "agree" to be compatible with the library or are willing to develop a plug-in that uses the library's functionality. The second case is more challenging and yet more powerful. It is powerful because compression and decompression are fully integrated with the file system that manages access to multiple types of files, making the functionality transparent to and compatible with many applications. Such transparency and compatibility comes from the fact that it is a responsibility of the file system to identify read and write requests that are directed to files that have been compressed and to carry out the decompression of the data corresponding to those requests when necessary. This is typically the case in modern operating systems.

The challenges with this approach lie in the fact that storage systems and their associated file systems intrinsically manage files on a block-by-block basis, meaning that files are nothing but a collection of bytes organized in blocks spread throughout the physical layer of the storage device. As seen above, blocks (or chunks) may not be the most favorable file organization for enabling random access to compressed seismic data. In particular, block subdivisions might hinder the compression ratios of the Max versions of the aforementioned Minimal-Length algorithm 200 and Alignment compression algorithm 300, as stated above. The problem is then how to embed in the file system a mechanism for efficient access to compressed data that enables the reconstruction of the blocks of the original file on demand. Additionally, this mechanism should consider that the compression will be done at the level of the file, thus not being constrained by the underlying blockwise structure of files within the file system.

Localized Queries

Seismic interpretation is a phase of the seismic processing workflow in which patterns used to identify hydrocarbon reservoirs are searched for within seismic datasets. This is usually an interactive procedure in which different parts of the dataset are accessed over time. In addition, pattern matching procedures can be automated, such as those proposed in U.S. patent application Ser. No. 14/672,516, filed Mar. 30, 2015, entitled "Methods and Apparatus for Parallel Evaluation of Pattern Queries Over Large N-Dimensional Datasets to Identify Features of Interest," incorporated by reference herein. The pattern query corresponds to a set of seismic trace fragments which define a feature one would like to find within a seismic dataset. The execution of the query identifies regions in the dataset encompassing traces which form a feature similar to that of the pattern query. The similarity between two sets of traces (i.e., pattern query and seismic dataset traces) is evaluated by mapping samples in one set to those in the other set. A metric is then computed to measure the similarity and to rank the candidate features returned by the query.

Imagining that the dataset of traces comprises samples and associated features, one can suppose that pattern queries such as the above will visit "feature-rich" areas of the datasets more frequently than "feature-less" ones. If the entire dataset is compressed, it would be interesting if those areas (e.g., samples and traces) visited more frequently could be decompressed independently from and, ideally, more efficiently than the others.

Again, block (or chunk) subdivisions of the original, uncompressed data could provide the required decompression independence. However, the identification and registration of features associated with seismic datasets is a dynamic process, meaning that it evolves over time. For the block-based compression to work efficiently in this case, different parts of the original file should be compressed based on different block (or chunk) sizes, so that those parts being accessed more frequently were more quickly decompressed. Moreover, chunk sizes would need to change according to modifications in the interpretation of the features, but as stated above, changing chunk sizes requires recompressing the entire dataset again, which is impractical. Finally, if compression embedded in block-based file systems is considered, it is not possible to store files with varying block sizes. Consequently, a more flexible and adaptive indexing mechanism is called for.

Multiple Resolutions

Image compression algorithms such as JPEG2000 provide mechanisms for multi-scale image representations. Namely, they enable the inclusion of different resolutions of the compressed image in a single file. This is particularly useful for progressive decompression when viewing large images through low bandwidth network connections. However, the size of the compressed file naturally increases to accommodate the different resolutions. In addition, the resolutions are usually defined a priori and cannot be changed after compression.

Seismic data visualization is a computationally intensive process, given the massive amounts of data that often need to be read, transmitted, and manipulated. In many cases, visualization can be performed on lower resolutions of the original dataset. For example, in the seismic queries described in the previous section, a visualization tool could provide more detailed views of feature-rich areas, in comparison with areas with few interesting features. It would be very relevant to be able to generate lower resolutions on demand, directly from the compressed data. Furthermore, it would be important not to increase storage use in order to generate the versions of the data in lower resolutions.

Bitwise Indices for Random Access to Compressed Data

As noted above, one or more embodiments of the exemplary random access data decompression techniques described herein are suited for the content-aware lossless compression algorithms. The content-aware lossless compression algorithms are capable of yielding high compression of data, such as seismic data, at unprecedented speed, while preserving a good level of sample independency to enable random access to portions of the compressed data. The proposed random access data decompression techniques thus take advantage of such characteristics and create a mechanism that allows on-demand decompression of portions of compressed data, such as SEGY headers and seismic samples. The exemplary random access data decompression techniques are based on the creation of indices during the compression, which take into account different types of data within the seismic data files (namely, headers and samples). The exemplary random access data decompression techniques optionally combine the indices with cache and prefetching during the decompression, in order to allow efficient data access by means of both domain-specific primitives (based on samples, traces, and headers) and file system primitives (based on byte arrays and file blocks).

Bitwise Index Tables for Accessing Compressed Bit Streams

As used herein, an index table is a structure that enables the creation of markers associated with specific parts of a given file. Each index indicates a logical position within the file, for example, relative to position zero. A file is a collection of bytes logically grouped and managed by a computer's operating system. An index thus generally translates itself into a byte offset within the file.

FIG. 4 illustrates a logical sequence 410 of bytes $B_i$ of a compressed file F and an exemplary associated index table (T) 420. According to one aspect of the invention, the exemplary index table 420 stores markers to bits within the referred compressed file F, rather than bytes. As shown in FIG. 4, each index, IDX, of the table 420 associates a sample index (or byte offset) within the original file with an offset of bits into the compressed file, relative to index $IDX_{j-i}$.

In order to effectively implement a solution for seismic sample requests, for example, based on such bitwise indices to compressed data files, a relation that maps samples within the original seismic dataset to their corresponding initial bits within the compressed bit stream must be created. Alternatively, the indices could correspond to a mapping between byte offsets within the original file and bit offsets in the compressed bit stream, since seismic processing applications are aware of the structure of SEGY files and can access the bytes thereof according to such structure.

FIG. 5 is a flow chart illustrating an exemplary implementation of random access data decompression process 500 according to one embodiment of the invention. Assume that a requested sample i is located in byte $B_5$ of the compressed file F in FIG. 4. A seismic sample query of the form "SELECT SAMPLE(i) FROM COMPRESSED_DATA" could be resolved with the following steps. Initially, as shown in FIG. 5, the exemplary random access data decompression process 500 finds in the index table 420 associated with the compressed data during step 510 the bit index b, whose associated sample index (or corresponding byte offset within the original file) is the closest to i, being less than or equal to i (in FIG. 4, the index in $IDX_1$).

During step 520, the exemplary random access data decompression process 500 finds in the compressed file F the byte B=b/8, which contains the bit index retrieved from the index table (in FIG. 4, byte $B_3$). That byte is then read from the file during step 530 and bit b=b modulo 8 is accessed within byte B. The seismic samples are decompressed during step 540, starting at $\hat{b}$ until sample i is reached.

In the Turbo versions of the exemplary content-aware lossless compression algorithms, each seismic sample can be decompressed, in theory, independently from the others, based only on the compressed value itself and associated metadata. The only interdependency between the samples is related to how the compressed samples are laid out in the compressed file. Given the inherent variable length of the bit stream, the location of sample i in the file can only be known after sample (i−1) has been decoded. Each index of the index table 420 thus marks the beginning of a compressed bit stream so that only a small subset of samples needs to be decoded before sample i is obtained. Typically, indices would be aligned with seismic traces, but this is not a constraint. For example, if efficient sub-trace access is required, indices with lower granularity can be used as well.

In the Max versions of the content-aware lossless compression algorithms, the adaptive linear predictors employed for max compression are usually trace-based. Therefore, indices should ideally match trace borders. Still, if indexed access to samples within traces were required, the state of the predictor (for instance, the coefficients of the predictor) at the sub-trace level could be stored along with the respective sample index, as discussed further below in conjunction with FIG. 7. In this way, the state of the predictor at the decompression phase could be restored at any indexed point, enabling the execution of queries similar to the one discussed above in conjunction with FIG. 5, over files compressed with the Max versions of the content-aware lossless compression algorithms. This solution increases the overhead of index management, but largely improves sample retrieval performance with the Max version of the compression algorithms.

FIGS. 6A and 6B, collectively, illustrate pseudo code 600 for an exemplary compression algorithm that compresses seismic samples and headers of an input file using the Turbo version of the content-aware lossless compression algorithms and creates the bitwise index table 420 for posterior random access to the compressed data. The exemplary pseudo code 600 sets up a number of index-related variables in section 610, compresses samples in section 620, and creates an index for the sample, if needed, in section 630.

Section 615 of the exemplary pseudo code 600 separates headers from seismic samples and focuses on the compression of seismic samples only. The proposed bitwise index table easily generalizes to also enable the transparent retrieval of information from the bit stream of a compressed header. For example, indices could mark the boundaries between compressed headers. Since SEGY headers have fixed and predetermined sizes, it would be straightforward to identify whether a byte offset within the original file corresponds to sample or header information, as would be apparent to a person of ordinary skill in the art. Each byte offset corresponding to the beginning of header data could then be associated with a bitwise index in the header's compressed bit stream. Consequently, the sample query discussed above in conjunction with FIG. 5 could be replaced with one that requests an array of bytes of the original data encompassing both headers and samples (an entire trace, for instance), which would be read from their respective compressed bit streams, decompressed, and properly assembled as one piece of information. As discussed further below in conjunction with FIGS. 8A-8D, a sequence of bytes representing headers and samples can be read directly from the compressed bit streams using the proposed index tables (assuming that indices are aligned with traces and that the number of samples per seismic trace is known).

Figure 7:
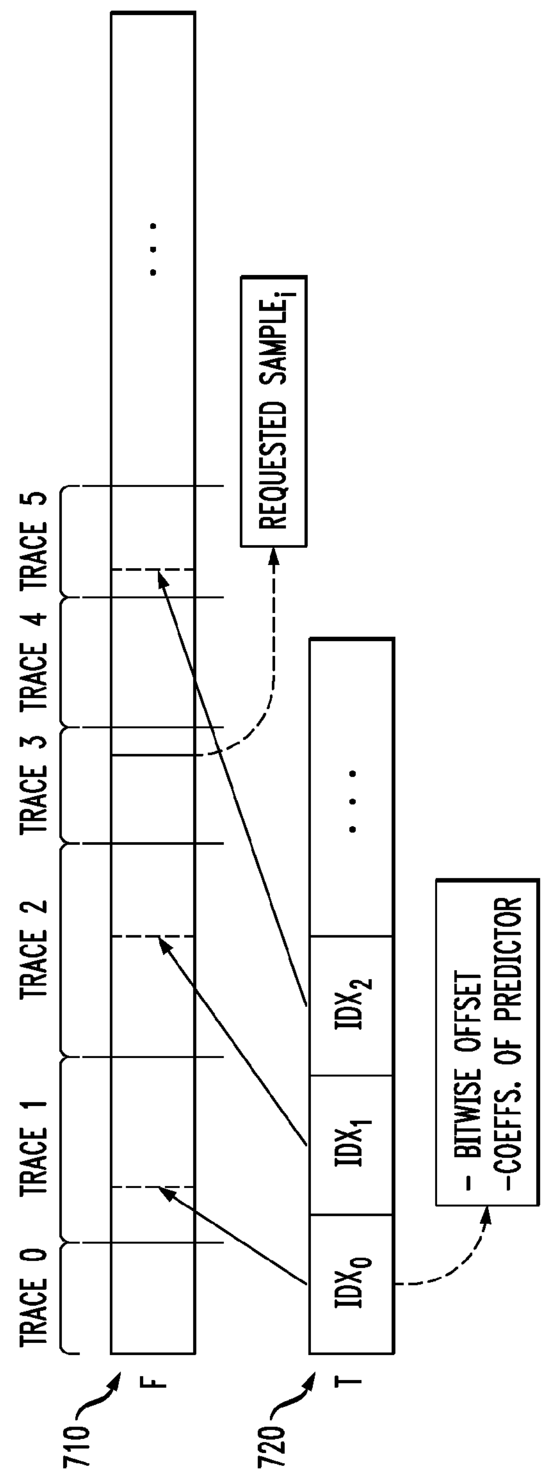
FIG. 7 illustrates a logical sequence of traces of a compressed file and an exemplary associated index table that stores state information.

FIG. 7 illustrates a logical sequence 710 of traces of a compressed file F and an exemplary associated index table (T) 720 that stores state information. As noted above, for indexed access to samples within traces, the state of the predictor (for instance, the coefficients of the predictor) at the sub-trace level could be stored along with the respective sample index. The exemplary index 720 can be used, for example, with the Max versions of the content-aware lossless compression algorithms in order to allow sub-trace access to the compressed data. Each index in T stores the bitwise index to the compressed file F, as discussed above in conjunction with FIG. 4, along with the coefficients of the linear predictor, so that the state of the predictor can be restored at any indexed point.

FIGS. 8A through 8D, collectively, illustrate pseudo code 800 for an exemplary random access data retrieval process that uses the bitwise index tables to retrieve exemplary seismic data comprising headers and samples directly from a compressed file. The exemplary pseudo code 800 of FIG. 8 allows any combination of samples, traces, or headers to be obtained from the compressed data, at random, that is, following no specific order or access pattern. Additionally, given the intrinsic structure of the compressed bit streams generated by the exemplary content-aware lossless compression algorithms, samples can be retrieved in any direction (forwards or backwards) from a certain position determined by the index table.

As shown in FIG. 8A, the exemplary pseudo code 800 sets up a number of index-related variables in section 810 and distinguishes between headers and trace data in section 815. Headers are processed in section 820 (FIGS. 8B and 8C). In particular, the appropriate entry is found in the index table of the headers and the current header is decompressed, starting at the bitwise location within the compressed data associated with the retrieved index. The number of bytes of the decompressed portion of the header is computed using the byte offset within the original file associated with the retrieved index and the initial byte of the decompressed portion of the header is computed. Finally, in section 820 the output is accumulated.

Similarly, traces are processed in section 830 (FIGS. 8C and 8D).

Integration with Block-Based File Systems

According to another aspect of the invention, the disclosed random access data decompression techniques are integrated with a file system that manages access to multiple types of files, making the functionality transparent to and compatible with many applications.

As mentioned above, seismic processing applications at large know the structure of SEGY files and thus retrieve seismic data according to byte offsets and ranges of bytes within the files. In order to enable transparent access to the compressed data, a block-based file system would need to know how to locate the referred offsets within the blocks of the corresponding compressed bit streams and how to rebuild the original data, combining headers and traces.

By construction, file systems know how to translate byte offsets into block addresses, so that the blocks corresponding to the requested bytes can be read from the storage device. The disclosed bitwise index tables proposed here are optionally integrated with a file system so that the offsets within the original files can eventually be associated with locations within the blocks of the compressed bit streams. During compression (which could also be transparently triggered), the index tables would be created, but the file system would hide the index tables from the applications.

For decompression, an application would, for example, request a sequence of bytes of the original file. Essentially, the decompression would be implemented with a procedure similar to the exemplary pseudo code 800 for the random access data retrieval process of FIGS. 8A-8D, but taking into account the need to rebuild all the blocks of the file system that contain the requested bytes.

Figure 9:
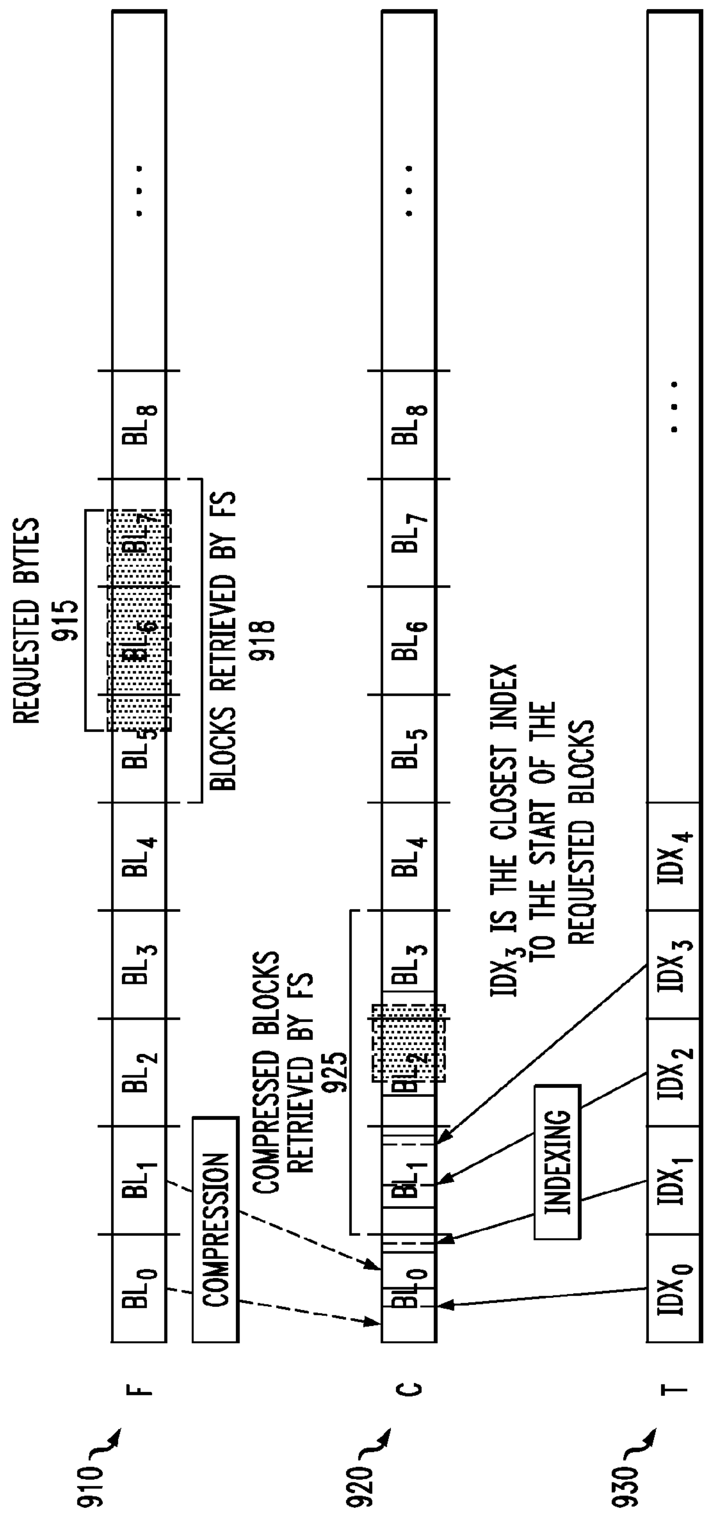
FIG. 9 illustrates a logical sequence of blocks of an original file of a block-based file system that is compressed into a compressed file and an exemplary associated index table.

FIG. 9 illustrates a logical sequence 910 of blocks $BL_i$ of an original file F of a block-based file system that is compressed into a compressed file (C) 920, and an exemplary associated index table (T) 930. As shown in FIG. 9, a range of bytes 915 of the original file F is requested by an application. The file system (FS) identifies that F has been compressed into compressed file C and the file system computes which blocks 918 of the original file F contain the requested bytes (i.e., $BL_5$ to $BL_7$). $BL_5$ to $BL_7$ are the blocks that will need to be decompressed and reconstructed before satisfying the application's byte request.

The file system then locates in the index table (T) 930 associated with the compressed data (for headers and samples) which blocks of compressed file C should be retrieved (i.e., BL1 to BL3), given the start offset of the requested blocks of the original file F (e.g., which indices are the closest to the start offset of the retrieved blocks of the original file).

For the sake of simplicity, consider that the requested bytes contain only sample data (no headers) and that, in FIG. 9, compressed file C contains the compressed samples of original file F. Consider as well that index table (T) 930 is the index table associating bitwise positions in compressed file C with samples (or byte offsets) within the original file F. The parts of the compressed sample data that correspond to the requested sequence of bytes are represented by the region 925 in compressed file C. The closest previous index to this part is $IDX_3$ of T.

Thus, in the example of FIG. 9, IDX3 marks from which point the decompression should start, until the original blocks are reconstructed. Notice that decompression values corresponding to the requested bytes are located in blocks BL2 and BL3, but decompression needs to start at the bit in BL1 pointed by IDX3. The block of the compressed data containing the bit mapped by $IDX_3$ would then be retrieved (namely, $BL_1$ of C).

The decompression would finally start from the bitwise location within the retrieved block and would continue until all the requested blocks of the original file F were regenerated. Note that if the requested bytes of the original file F also contained headers, a similar procedure would be required to locate the headers in the compressed header file, retrieve them, decompress them, and mix them with the decompressed samples.

With this procedure, any sequence of bytes contained in blocks can be obtained from the compressed data, at random. It would not be necessary to follow any specific order or access pattern. The data access would occur in a transparent manner, directly from the file system, without modifications to any application accessing the compressed files.

Adaptive Indexing

As suggested above, within the compressed bit stream encompassed by two neighbor indices, the i-th seismic sample can only be obtained after sample (i−1) has been decompressed, given the inherent variable length encoding of the exemplary compressed seismic samples. As a consequence, the number of indices in the table has a direct relationship with the efficiency of seismic sample queries.

In the seismic interpretation applications and associated localized queries, queries might be executed frequently over areas containing interesting features. In order to make those queries more efficient with compressed data files, one could increase the number of indices pointing to those parts of the compressed data that correspond to interesting features that tend to be selected more frequently. With the bitwise index tables disclosed herein, adding or removing indices is an operation that does not require the recompression of the entire dataset, as would be the case in chunk-based subdivisions. Although the index table 400 is naturally created during the execution of the compression algorithms, the table can be entirely recreated directly from the compressed bit stream, without rerunning the compression. This is possible due to the intrinsic sample independency provided by the exemplary content-aware lossless compression algorithms.

This adaptive nature of the index table also couples well with traditional indices used in spatial databases, such as R-Trees and QuadTrees. See, for example, Guttman Antonin, "R-Trees: A Dynamic Index Structure for Spatial Searching," J. ACM SIGMOD Record, Vol. 2.-pp. 47-57 (1984, Boston, Mass.); and Hanan Samet and Webber Samet, "Storing a Collection of Polygons Using Quadtrees," J. ACM Trans. on Graphics," pp. 182-222 (1985, Boston, Mass.). Namely, more indices could be added to the index table in areas corresponding to finer detail encoded by an R-Tree or a QuadTree.

Figure 10:
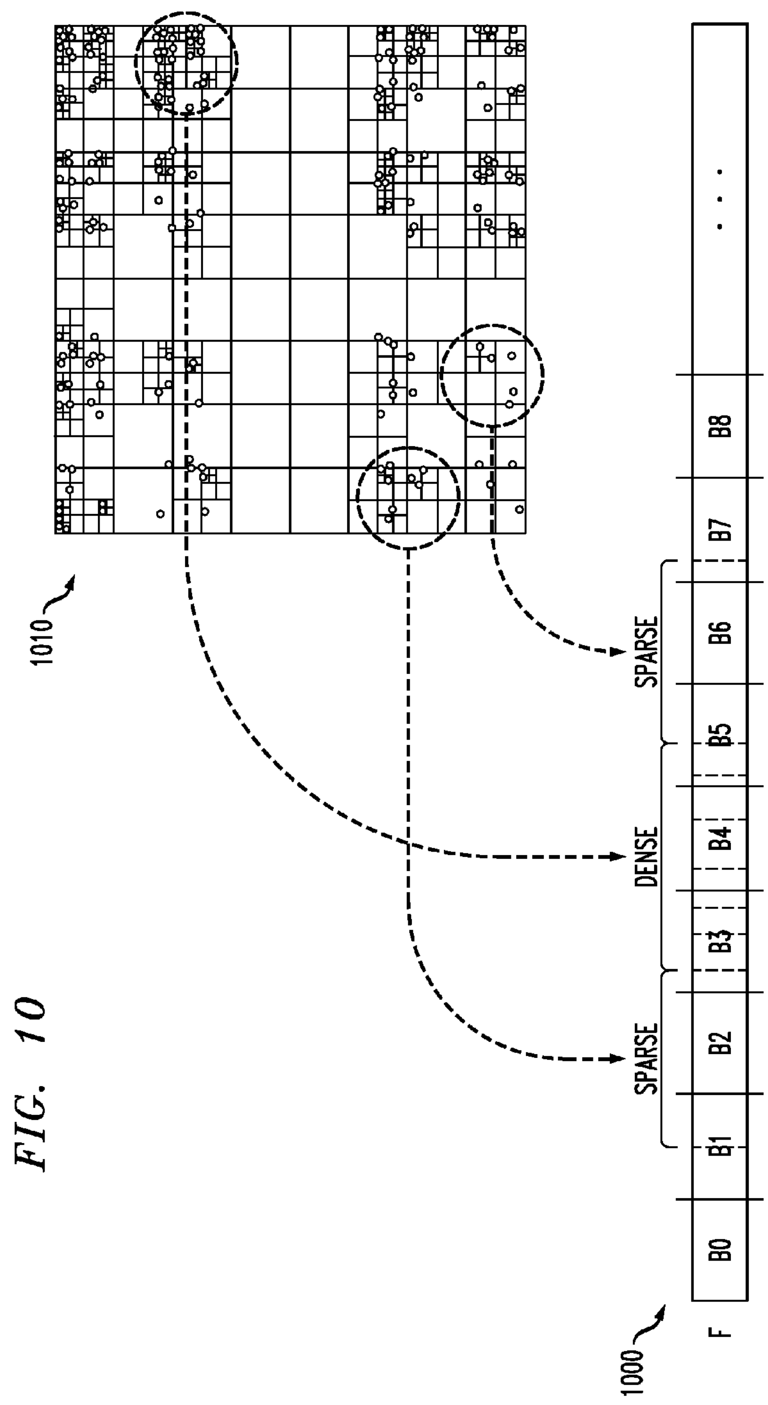
FIG. 10 illustrates adaptive indexing of a compressed file based on an access frequency.

FIG. 10 illustrates sparse and dense indexing over compressed file F 1000 associated with a QuadTree 1010. Dense indexing is employed with an increased number of indices pointing to those parts of the compressed data that are accessed more frequently and sparse indexing is employed with a reduced number of indices pointing to those parts of the compressed data that are accessed less frequently.

For a more detailed discussion of pattern queries, see, for example, U.S. patent application Ser. No. 14/672,516, filed Mar. 30, 2015, entitled "Methods and Apparatus for Parallel Evaluation of Pattern Queries Over Large N-Dimensional Datasets to Identify Features of Interest," incorporated by reference herein.

Cache and Pre-Fetching for Decompression

Fast access to compressed data is dependent on how many indices are used to mark decompression points, as described in the previous section. As a general rule, the more indices, or the shorter the interval between the file positions related to them, the more efficiently the data samples can be read from the compressed file. However, increasing the number of indices also increases the space overhead and the complexity of index management.

In seismic processing workflows, samples and traces are often revisited several times or grouped by some special criteria and processed together. For example, in a seismic data visualization tool, a user may navigate over different parts of the data and review them, moving back and forth. In addition, in many seismic processing algorithms, such as Reverse Time Migration (RTM) and Kirchoff Migration (see, for example, Yilmaz Oz, Seismic Data Analysis: Processing, Inversion, and Interpretation of Seismic Data, (2001, Society of Exploration Geophysicists), seismic samples and traces are grouped in "gathers" and processed together. RTM algorithms process traces gathered according to the shots that generated them, while Kirchoff Migration gathers group traces that correspond to the same midpoint between different pairs {source, receiver}.

In order to help balance the overhead of the index table with efficient sample queries over compressed files, it would be ideal if subsets of decompressed samples were already in memory, so that queries could be promptly satisfied with little or no access to the storage. This naturally evokes the concept of a cache.

Moreover, some applications have a very predictable way of traversing the data. This predictability can leverage the cache concept by means of a pre-fetch strategy to obtain data from a file ahead of its use. The key idea is that such data is read from disk concurrently with the application that queries the data. When the data is finally requested by the application, it is already available in memory. This is known as pre-fetching.

The decompression mechanism disclosed herein can be seamlessly integrated with cache and pre-fetching techniques to provide access to the compressed data. Following the locality principle, which represents the basis of cache construction, there is a good chance that the next seismic sample (or trace) requested will also belong to the same trace (or group of traces) and will thus be returned to the main application immediately, without additional disk accesses. In the example of the seismic data visualization tool given above, samples corresponding to revisited areas of the data could be accessed directly from memory instead of from disk. In the RTM example, in turn, all traces belonging to a common shot gather could be pre-fetched from disk, decompressed, and stored in the cache once the request for the first trace of that group has been made. The advantage of using the proposed index tables is to allow applications to jump to random parts of the compressed file and pre-fetch the required data efficiently.

Quality-Oriented Decompression

Multi-resolution representations of images are obtained by generating subsampled versions of the original image. The number of samples is often determined by a quality parameter $Q\in(0, 1]$, where Q=1 means the original image.

Since the exemplary content-aware lossless compression algorithms are lossless, the subsampled image can be generated on-demand, according to Q, leaving to the recipient the responsibility of, e.g., interpolating the samples to generate a visualization of the low resolution dataset. Note that Q can be set to any value and even change dynamically, yielding different subsampling quality for different parts of the file, all without any space overhead. Reading the compressed data in strides of fixed or variable length can thus be largely optimized through the use of the proposed index table.

The potential dynamism of the quality parameter again couples with the possibility of having variable index density according to areas containing features of interest. In other words, feature-rich areas that demand higher quality can be associated with higher index density, in such a way that the referred data can be more efficiently queried at any desired quality.

Examples

Updating Index Table to Efficiently Satisfy Localized Queries

Suppose that a system for seismic pattern queries has been integrated with a software library implementing the content-aware lossless compression algorithms and the random access decompression mechanisms disclosed herein. In this way, every seismic data request would inevitably be handled by the library. As a result, the library could implement another mechanism in which the frequency of requests for certain areas of seismic files would be tracked. By ranking the file regions in order of frequency of access, the library could constantly update the index table to make more frequent requests more efficient. For example, indices could be added to the index tables in order to decrease the offset between subsequent indices covering the frequently accessed file regions. An algorithm similar to those discussed above in conjunction with FIGS. 6A and 6B could be implemented to update the index table. The difference would be that only the compressed bit streams and the associated index tables would be traversed, meaning that no access to the original file would be required. In effect, the original file could even be deleted after being compressed.

Seismic Visualization Tool with Cache and Pre-Fetching

Imagine a seismic visualization tool in which the user can easily navigate through the data, by either traversing it sequentially or randomly jumping to different parts. Suppose that the tool is transparently accessing a compressed seismic file and that decompression of portions of the file is carried out on demand, taking advantage of the bitwise index tables disclosed herein and of the cache and pre-fetching mechanisms.

Figure 11:
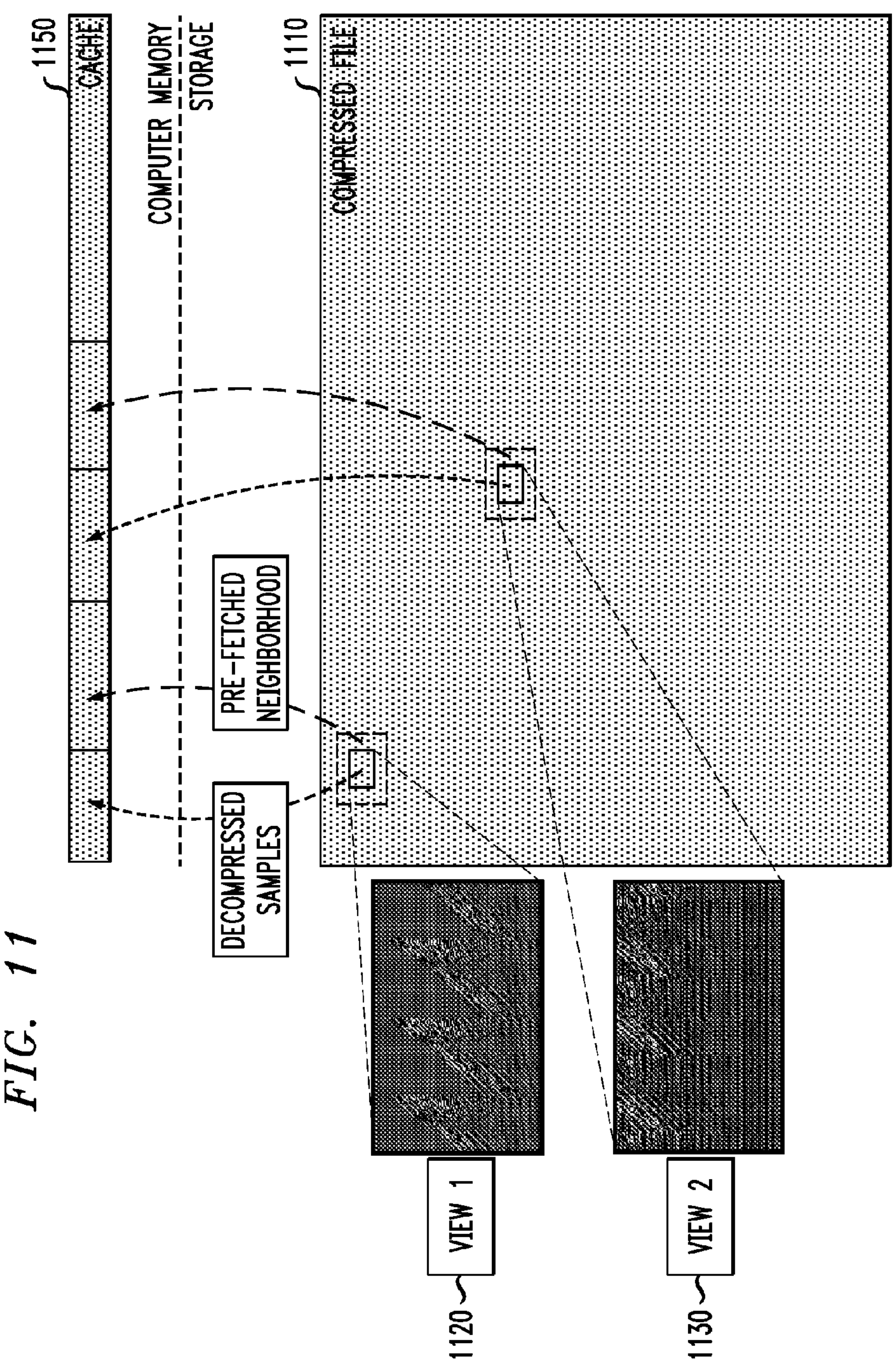
FIG. 11 illustrates an exemplary seismic visualization tool accessing a compressed file and employing caching and pre-fetching for efficiently satisfying sample requests.

FIG. 11 illustrates an exemplary seismic visualization tool accessing a compressed file 1110 and employing caching and pre-fetching for efficiently satisfying sample requests. Suppose that the user starts by visualizing a portion of the file equivalent to "View 1" 1120. Such view 1120 corresponds to a range of seismic samples taken from different traces. It has been shown above how the request to obtain such samples from the compressed data could be implemented using the disclosed bitwise index tables. A caching algorithm could then place the decompressed samples in an area of computer memory and leave them there for posterior use. Additionally, a pre-fetching scheme could suppose that, subsequently, the user would probably navigate through regions of the file 1110 corresponding to samples in the neighborhood of those retrieved for "View 1" 1120. A request to retrieve and decompress those samples would be triggered in parallel with the request for samples of "View 1" 1120, and the pre-fetched samples would also be placed in the memory cache. Suppose now that the user indeed navigates over those areas that neighbor the samples in "View 1" 1120. The corresponding samples would probably be available in the cache 1150 and the request could be promptly satisfied without any access to the storage.

If the user then jumps to the region corresponding to "View 2" 1130, the required samples would be read from disk, decompressed, and placed in the cache 1150. In the same way as above, neighbors of "View 2" 1130 would be pre-fetched, decompressed, and placed in the cache 1150. If either the neighbors of "View 2" 1130 or any of the samples in "View 1" 1120 or in their neighborhood are requested afterwards, the requests would always be satisfied with data from the cache 1150, without any access to the storage.

When the cache 1150 is completely filled, a mechanism for freeing memory would discard samples, possibly employing a variation of the well-known LRU (least recently used) method. The freed memory would then be used again for storing requested and pre-fetched samples.

Seismic Processing

In seismic processing algorithms, traces are usually processed in groups (gathers). In the Reverse Time Migration (RTM), for example, traces originated from the same acoustic shot are processed together. In general, these traces are laid out sequentially in the corresponding SEGY file. If the file is compressed with a content-aware lossless compression algorithm, they are also laid out sequentially in the compressed bit stream. If the RTM algorithm is interacting directly with the compressed file (either through a software library or transparently through the file system) the traces could be retrieved on demand via the proposed bitwise index tables (as illustrated in the pseudo code 800 of FIGS. 8A-8D). In this way, they would be found and read very efficiently, without impacting the overall performance of the algorithm. In fact, the performance could even be improved, given that access to disk will be reduced because less (i.e., compressed) data will be read.

Since seismic processing applications are usually executed in a distributed High Performance Computing (HPC) environment, the different computing nodes can access different parts of the compressed data transparently. The cache and pre-fetching mechanism could even improve the per-node access to the file if the traces that are candidates to be processed by the processing application in the next iterations were retrieved ahead of their use and put in the node's cache. All this without having to regenerate the original file from its compressed version.

CONCLUSION

Aspects of the present invention are described herein with reference to flowchart illustrations and/or block diagrams of methods, apparatus (systems) and computer program products according to embodiments of the invention. It is to be appreciated that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

As further described herein, such computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. Accordingly, as further detailed below, at least one embodiment of the invention includes an article of manufacture tangibly embodying computer readable instructions which, when implemented, cause a computer to carry out techniques described herein. An article of manufacture, a computer program product or a computer readable storage medium, as used herein, is not to be construed as being transitory signals, such as electromagnetic waves.

The computer program instructions may also be loaded onto a computer or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, component, segment, or portion of code, which comprises at least one executable instruction for implementing the specified logical function(s). It should be noted that the functions noted in the block may occur out of the order noted in the figures.

Accordingly, the techniques described herein can include providing a system, wherein the system includes distinct software modules, each being embodied on a tangible computer-readable recordable storage medium (for example, all modules embodied on the same medium, or each modules embodied on a different medium). The modules can run, for example, on a hardware processor, and the techniques detailed herein can be carried out using the distinct software modules of the system executing on a hardware processor.

Additionally, the techniques detailed herein can also be implemented via a computer program product that includes computer useable program code stored in a computer readable storage medium in a data processing system, wherein the computer useable program code was downloaded over a network from a remote data processing system. The computer program product can also include, for example, computer useable program code that is stored in a computer readable storage medium in a server data processing system, wherein the computer useable program code is downloaded over a network to a remote data processing system for use in a computer readable storage medium with the remote system.

As will be appreciated by one skilled in the art, aspects of the present invention may take the form of an entirely hardware embodiment, an entirely software embodiment (including firmware, resident software, micro-code, etc.) or an embodiment combining software and hardware aspects that may all generally be referred to herein as a "module" or "system."

An aspect of the invention or elements thereof can be implemented in the form of an apparatus including a memory and at least one processor that is coupled to the memory and operative to perform the techniques detailed herein. Also, as described herein, aspects of the present invention may take the form of a computer program product embodied in a computer readable medium having computer readable program code embodied thereon.

Figure 12:
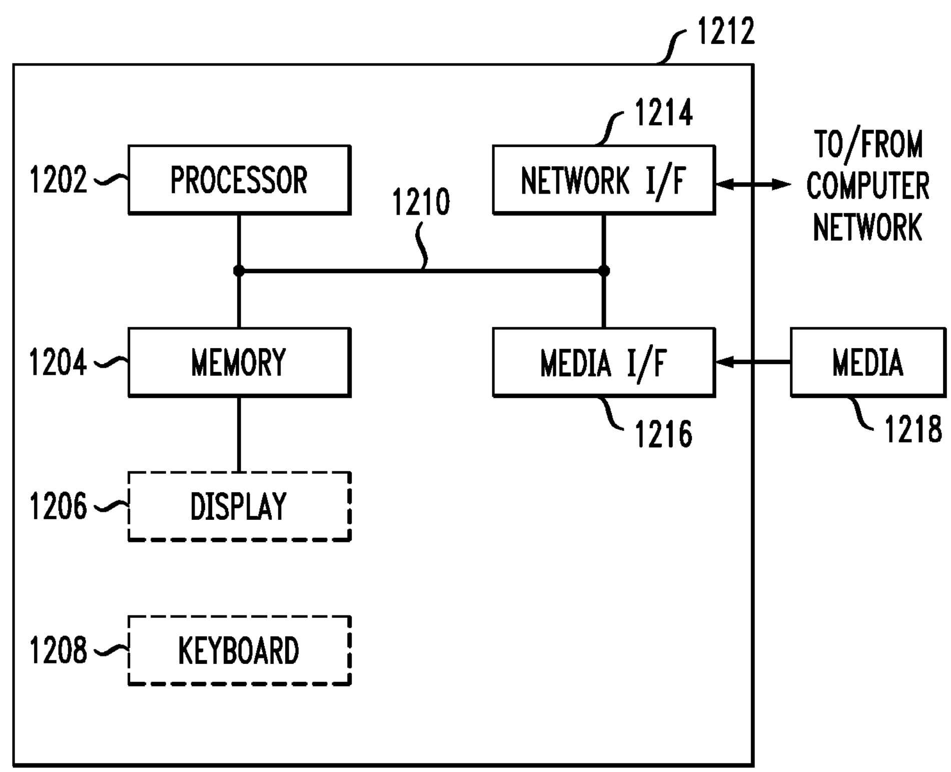
FIG. 12 is a system diagram of an exemplary computer system on which at least one embodiment of the invention can be implemented.

By way of example, an aspect of the present invention can make use of software running on a general purpose computer. FIG. 12 is a system diagram of an exemplary computer system on which at least one embodiment of the invention can be implemented. As depicted in FIG. 12, an example implementation employs, for example, a processor 1202, a memory 1204, and an input/output interface formed, for example, by a display 1206 and a keyboard 1208. The term "processor" as used herein includes any processing device(s), such as, for example, one that includes a central processing unit (CPU) and/or other forms of processing circuitry. The term "memory" includes memory associated with a processor or CPU, such as, for example, random access memory (RAM), read only memory (ROM), a fixed memory device (for example, a hard drive), a removable memory device (for example, a diskette), a flash memory, etc. Further, the phrase "input/output interface," as used herein, includes a mechanism for inputting data to the processing unit (for example, a mouse) and a mechanism for providing results associated with the processing unit (for example, a printer).

The processor 1202, memory 1204, and input/output interface such as display 1206 and keyboard 1208 can be interconnected, for example, via bus 1210 as part of a data processing unit 1212. Suitable interconnections via bus 1210, can also be provided to a network interface 1214 (such as a network card), which can be provided to interface with a computer network, and to a media interface 1216 (such as a diskette or compact disc read-only memory (CD-ROM) drive), which can be provided to interface with media 1218.

Accordingly, computer software including instructions or code for carrying out the techniques detailed herein can be stored in associated memory devices (for example, ROM, fixed or removable memory) and, when ready to be utilized, loaded in part or in whole (for example, into RAM) and implemented by a CPU. Such software can include firmware, resident software, microcode, etc.

As noted above, a data processing system suitable for storing and/or executing program code includes at least one processor 1202 coupled directly or indirectly to memory elements 1204 through a system bus 1210. The memory elements can include local memory employed during actual implementation of the program code, bulk storage, and cache memories which provide temporary storage of at least some program code in order to reduce the number of times code must be retrieved from bulk storage during implementation. Also, input/output (I/O) devices such as keyboards 1208, displays 1206, and pointing devices, can be coupled to the system either directly (such as via bus 1210) or through intervening I/O controllers.

Network adapters such as network interface 1214 (for example, a modem, a cable modem or an Ethernet card) can also be coupled to the system to enable the data processing system to become coupled to other data processing systems or remote printers or storage devices through intervening private or public networks.

As used herein, a "server" includes a physical data processing system (such as system 1212 as depicted in FIG. 12) running a server program. It will be understood that such a physical server may or may not include a display and keyboard.

As noted, at least one embodiment of the invention can take the form of a computer program product embodied in a computer readable medium having computer readable program code embodied thereon. As will be appreciated, any combination of computer readable media may be utilized. The computer readable medium can include a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Examples include an electrical connection having one or more wires, a portable computer diskette, a hard disk, RAM, ROM, an erasable programmable read-only memory (EPROM), flash memory, an optical fiber, a portable CD-ROM, an optical storage device, a magnetic storage device, and/or any suitable combination of the foregoing. More generally, a computer readable storage medium may be any tangible medium that can contain, or store a program for use by or in connection with an instruction execution system, apparatus, or device.

Additionally, a computer readable signal medium may include a propagated data signal with computer readable program code embodied therein, for example, in baseband or as part of a carrier wave. Such a propagated signal may take any of a variety of forms such as, for example, electro-magnetic, optical, or a suitable combination thereof. More generally, a computer readable signal medium may be any computer readable medium that is not a computer readable storage medium and that can communicate, propagate, or transport a program for use by or in connection with an instruction execution system, apparatus, or device.

Program code embodied on a computer readable medium can be transmitted using an appropriate medium such as, for example, wireless, wireline, optical fiber cable, radio frequency (RF), and/or a suitable combination of the foregoing. Computer program code for carrying out operations in accordance with one or more embodiments of the invention can be written in any combination of at least one programming language, including an object oriented programming language, and conventional procedural programming languages. The program code may execute entirely on a user's computer, partly on a user's computer, as a stand-alone software package, partly on a user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

In light of the above descriptions, it should be understood that the components illustrated herein can be implemented in various forms of hardware, software, or combinations thereof, for example, application specific integrated circuit(s) (ASICS), functional circuitry, an appropriately programmed general purpose digital computer with associated memory, etc.

Terminology used herein is for the purpose of describing particular embodiments only and is not intended to be limiting of the invention. For example, the singular forms "a," "an" and "the" are intended to include the plural forms as well, unless clearly indicated otherwise. It will be further understood that the terms "comprises" and/or "comprising," as used herein, specify the presence of stated features, integers, steps, operations, elements, and/or components, but do not preclude the presence or addition of another feature, integer, step, operation, element, component, and/or group thereof. Additionally, the corresponding structures, materials, acts, and equivalents of all means or step plus function elements in the claims are intended to include any structure, material, or act for performing the function in combination with other claimed elements as specifically claimed.

Also, it should again be emphasized that the above-described embodiments of the invention are presented for purposes of illustration only. Many variations and other alternative embodiments may be used. For example, the techniques are applicable to a wide variety of other types of communication systems, storage systems and processing devices that can benefit from improved decompression of seismic data. Accordingly, the particular illustrative configurations of system and device elements detailed herein can be varied in other embodiments. These and numerous other alternative embodiments within the scope of the appended claims will be readily apparent to those skilled in the art.

What is claimed is:

1. A method, comprising:

obtaining a compressed file and a bitwise mapping between at least a portion of individual bits in said compressed file and corresponding portions of an uncompressed version of said compressed file, wherein said bitwise mapping comprises a pointer to an individual bit in said compressed file corresponding to a given portion of said uncompressed version of said compressed file; and decompressing at least a portion of said compressed file starting from said individual bit referenced by said pointer.

2. The method of claim 1, wherein said decompressed portion comprises a desired data sample and wherein said desired data sample is decompressed by (i) obtaining a bit index from said index table that is less than or equal to an index of said desired data sample, where the bit index of the desired data sample is relative to the uncompressed version of the desired data sample; (ii) identifying a byte in said compressed file that contains the obtained bit index; (iii) reading said identified byte from said compressed file and accessing a bit in said identified byte corresponding to said obtained bit index; and (iv) decompressing data samples starting at said accessed bit until said desired data sample is reached.

3. The method of claim 1, wherein a given entry of said index table comprises a bit index mapping a given individual bit in said compressed file to a corresponding portion of said uncompressed version and a corresponding state of a compression algorithm that compressed said compressed file at a time that said given individual bit was compressed.

4. The method of claim 3, wherein said corresponding state comprises one or more coefficients of a linear prediction algorithm.

5. The method of claim 1, wherein said index table can be one or more of recreated and updated without decompressing said compressed file and recompressing said file again.

6. The method of claim 1, wherein said index table is processed by a block-based file system to provide substantially transparent access to said compressed file.

7. The method of claim 6, wherein said block-based file system identifies one or more blocks of said uncompressed version that correspond to a requested sequence of bytes of said uncompressed version; obtains a bit index from said index table that is less than or equal to a starting index of said one or more identified blocks; retrieves a block of said compressed file containing a bit corresponding to said obtained bit index; and decompresses from a bitwise location within the retrieved block until said one or more identified blocks are regenerated.

8. The method of claim 1, wherein said index table is configured to adapt to dynamic variations of index granularity based on one or more of an access frequency and a feature density, without decompressing said compressed file.

9. The method of claim 1, wherein said decompressed portion of said compressed file is stored in a cache.

10. The method of claim 9, further comprising the steps of prefetching a neighborhood of said decompressed portion of said compressed file from said compressed file using said index table, decompressing said neighborhood of said decompressed portion and storing said decompressed neighborhood in said cache.

11. The method of claim 1, wherein said compressed file comprises a multi-resolution compression that incurs substantially no space overhead other than the creation of said index table and wherein said decompressed portion of said compressed file is decompressed based only on the index table and on a specified quality parameter.

12. The method of claim 1, wherein said index table is created during the compression process to enable random access to the compressed file.

13. The method of claim 1, wherein said method enables users to interact with the compressed file substantially as if they were interacting with an uncompressed version of the compressed file.

14. The method of claim 1, wherein input data are split into a plurality of data types and wherein corresponding indices are provided for each of said plurality of data types.

15. The method of claim 14, wherein random access to sequences of bytes corresponding to different data types with corresponding indices are decompressed and composed to generate a single decompressed byte stream that substantially matches the byte stream of the uncompressed versions of said sequences of bytes.

16. The method of claim 15, wherein said index tables are processed together by a block-based file system to provide transparent access to said compressed file.

17. A computer program product comprising a non-transitory machine-readable storage medium having encoded therein executable code of one or more software programs, wherein the one or more software programs when executed perform the following steps:

obtaining a compressed file and a bitwise mapping between at least a portion of individual bits in said compressed file and corresponding portions of an uncompressed version of said compressed file, wherein said bitwise mapping comprises a pointer to an individual bit in said compressed file corresponding to a given portion of said uncompressed version of said compressed file; and decompressing at least a portion of said compressed file starting from said individual bit referenced by said pointer.

18. A system, comprising:

a memory; and at least one hardware device, coupled to the memory, operative to implement the following steps:

obtaining a compressed file and a bitwise mapping between at least a portion of individual bits in said compressed file and corresponding portions of an uncompressed version of said compressed file, wherein said bitwise mapping comprises a pointer to an individual bit in said compressed file corresponding to a given portion of said uncompressed version of said compressed file; and decompressing at least a portion of said compressed file starting from said individual bit referenced by said pointer.

19. The system of claim 18, wherein said decompressed portion comprises a desired data sample and wherein said desired data sample is decompressed by (i) obtaining a bit index from said index table that is less than or equal to an index of said desired data sample, where the bit index of the desired data sample is relative to the uncompressed version of the desired data sample; (ii) identifying a byte in said compressed file that contains the obtained bit index; (iii)

reading said identified byte from said compressed file and accessing a bit in said identified byte corresponding to said obtained bit index; and (iv) decompressing data samples starting at said accessed bit until said desired data sample is reached.

20. The system of claim 18, wherein a given entry of said index table comprises a bit index mapping a given individual bit in said compressed file to a corresponding portion of said uncompressed version and a corresponding state of a compression algorithm that compressed said compressed file at a time that said given individual bit was compressed.

21. The system of claim 18, wherein said index table is processed by a block-based file system to provide substantially transparent access to said compressed file.

22. The system of claim 18, wherein said index table is configured to adapt to dynamic variations of index granularity based on one or more of an access frequency and a feature density, without decompressing said compressed file.

23. The system of claim 18, wherein said decompressed portion of said compressed file is stored in a cache and wherein said at least one hardware device is further operative to prefetch a neighborhood of said decompressed portion of said compressed file from said compressed file using said index table, decompress said neighborhood of said decompressed portion and store said decompressed neighborhood in said cache.

24. The system of claim 18, wherein said compressed file comprises a multi-resolution compression that incurs substantially no space overhead other than the creation of said index table and wherein said decompressed portion of said compressed file is decompressed based only on the index table and on a specified quality parameter.

25. The system of claim 18, wherein input data are split into a plurality of data types and wherein corresponding indices are provided for each of said plurality of data types.

26. The method of claim 1, wherein said compressed file is not bound to any specific subdivision.

27. The system of claim 18, wherein said compressed file is not bound to any specific subdivision.

* * * * *

UNITED STATES PATENT AND TRADEMARK OFFICE

CERTIFICATE OF CORRECTION

PATENT NO. : 9,503,123 B1
APPLICATION NO. : 14/749826
DATED : November 22, 2016
INVENTOR(S) : Romulo Teixeira de Abreu Pinho et al.

It is certified that error appears in the above-identified patent and that said Letters Patent is hereby corrected as shown below:

Column 15, Lines 4-5, replace “process 500 according to” with --process 500, according to--.

Column 16, Lines 61-62, replace “section 820 the output” with --section 820, the output--.

Column 19, Line 12, replace “Geophysicists), seismic” with --Geophysicists)), seismic--.

Signed and Sealed this
Second Day of May, 2017

Michelle K. Lee
*Director of the United States Patent and Trademark Office*